United States Patent
Tsuchimura et al.

(10) Patent No.: US 9,798,234 B2
(45) Date of Patent: Oct. 24, 2017

(54) RESIN COMPOSITION, RESIST FILM USING SAME, RESIST-COATED MASK BLANK, RESIST PATTERN FORMING METHOD, AND PHOTO MASK

(71) Applicant: FUJIFILM Corporation, Tokyo (JP)

(72) Inventors: Tomotaka Tsuchimura, Shizuoka (JP); Shuhei Yamaguchi, Shizuoka (JP); Natsumi Yokokawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/212,552

(22) Filed: Jul. 18, 2016

(65) Prior Publication Data
US 2016/0327862 A1 Nov. 10, 2016

Related U.S. Application Data

(63) Continuation of application No. PCT/JP2015/050633, filed on Jan. 13, 2015.

(30) Foreign Application Priority Data

Feb. 25, 2014 (JP) .................................. 2014-034038

(51) Int. Cl.
*G03F 7/004* (2006.01)
*G03F 7/038* (2006.01)
*C08K 5/13* (2006.01)
*C08F 12/22* (2006.01)
*C08F 12/30* (2006.01)
*C08F 212/14* (2006.01)
*C08F 212/32* (2006.01)
*C09D 125/18* (2006.01)
*G03F 1/50* (2012.01)
*G03F 7/20* (2006.01)
*G03F 7/32* (2006.01)

(52) U.S. Cl.
CPC .............. *G03F 7/038* (2013.01); *C08F 12/22* (2013.01); *C08F 12/30* (2013.01); *C08F 212/14* (2013.01); *C08F 212/32* (2013.01); *C08K 5/13* (2013.01); *C09D 125/18* (2013.01); *G03F 1/50* (2013.01); *G03F 7/004* (2013.01); *G03F 7/2059* (2013.01); *G03F 7/322* (2013.01)

(58) Field of Classification Search
CPC ...... G03F 7/038; G03F 7/0382; G03F 7/2059; C08F 12/14; C08F 212/14; C08F 212/32; C08F 8/00; C09D 125/18; C08L 321/04; C08K 5/13; C08K 5/0025
USPC ........ 430/5, 322, 325, 329, 270.1, 296, 905, 430/910; 427/388.2; 568/716; 528/86, 528/98
See application file for complete search history.

(56) References Cited

U.S. PATENT DOCUMENTS

| | | | | |
|---|---|---|---|---|
| 5,536,794 A * | 7/1996 | Yezrielev | ............. | C09D 133/06 525/418 |
| 7,090,960 B2 * | 8/2006 | Yasunami | ............. | G03F 7/0382 430/270.1 |
| 8,470,511 B2 * | 6/2013 | Masunaga | ............. | G03F 7/0382 430/270.1 |
| 2005/0238992 A1 * | 10/2005 | Kodama | ............... | G03F 7/0045 430/270.1 |
| 2005/0238997 A1 * | 10/2005 | De | ........................ | C09D 133/14 430/271.1 |
| 2011/0200942 A1 * | 8/2011 | Masunaga | ............. | G03F 7/0382 430/285.1 |
| 2013/0017376 A1 | 1/2013 | Okuyama et al. | | |
| 2013/0029254 A1 | 1/2013 | Tsuchimura et al. | | |
| 2014/0212811 A1 * | 7/2014 | Inoue | ..................... | C08F 212/14 430/285.1 |
| 2015/0010855 A1 * | 1/2015 | Tsuchimura | ............ | C08F 12/24 430/5 |
| 2015/0118623 A1 | 4/2015 | Tsuruta et al. | | |
| 2015/0132688 A1 * | 5/2015 | Yokokawa | ............ | G03F 7/0002 430/18 |
| 2015/0147697 A1 * | 5/2015 | Hatakeyama | ........... | C08F 12/20 430/285.1 |

FOREIGN PATENT DOCUMENTS

| | | |
|---|---|---|
| JP | 6-301200 A | 10/1994 |
| JP | 2013-29554 A | 2/2013 |
| JP | 2014-24999 A | 2/2014 |
| KR | 10-2013-0012916 A | 2/2013 |
| WO | 2011/118726 A1 | 9/2011 |

OTHER PUBLICATIONS

International Search Report of PCT/JP2015/050633, dated Feb. 24, 2015. [PCT/ISA/210].
Written Opinion of PCT/JP2015/050633, dated Feb. 24, 2015. [PCT/ISA/237].
International Preliminary Report on Patentability dated Aug. 30, 2016, in corresponding International Application No. PCT/JP2015/050633, with English translation of Written Opinion, 14 pages in English and Japanese.
Communication dated May 17, 2017 from the Korean Intellectual Property Office in counterpart Application No. 10-2016-7019384.
Communication dated May 23, 2017 from the Japanese Patent Office in counterpart Application No. 2014-034038.
Communication dated Feb. 14, 2017, from the Japanese Patent Office in counterpart Japan application No. 2014-034038.

* cited by examiner

*Primary Examiner* — Amanda C Walke
(74) *Attorney, Agent, or Firm* — Sughrue Mion, PLLC

(57) ABSTRACT

An actinic ray sensitive or radiation sensitive resin composition contains a polymer compound (A) having a phenolic hydroxyl group and satisfying the following (a) and (b), a compound (B) capable of generating an acid upon irradiation with actinic rays or radiation, and a crosslinking agent (C) for crosslinking the polymer compound (A) by the action of an acid and having a glass transition temperature (Tg) of 200° C. or higher:

(a) the weight-average molecular weight is 3,000 or more and 6,500 or less, and
(b) the glass transition temperature (Tg) is 140° C. or higher.

11 Claims, No Drawings

RESIN COMPOSITION, RESIST FILM USING SAME, RESIST-COATED MASK BLANK, RESIST PATTERN FORMING METHOD, AND PHOTO MASK

CROSS-REFERENCE TO RELATED APPLICATIONS

This application is a Continuation of PCT International Application No. PCT/JP2015/50633, filed on Jan. 13, 2015, which claims priority under 35 U.S.C. §119(a) to Japanese Patent Application No. 2014-034038, filed on Feb. 25, 2014. Each of the above application(s) is hereby expressly incorporated by reference, in its entirety, into the present application.

BACKGROUND OF THE INVENTION

1. Field of the Invention

The present invention relates to an actinic ray sensitive or radiation sensitive resin composition suitably usable in an ultramicrolithography process such as production of VLSIs or high-capacity microchips as well as in other fabrication processes and capable of forming a highly defined pattern by using an electron beam or extreme-ultraviolet rays, a resist film using the same, a resist-coated mask blank, a resist pattern forming method, and a photo mask.

2. Description of the Related Art

In conventional production processes of semiconductor devices such as ICs or LSIs, a microfabrication by lithography using a photoresist composition has been performed. In recent years, due to increasing integration of integrated circuits, the formation of ultrafine patterns in a sub-micron region or a quarter-micron region has been required.

A chemical amplification type resist composition containing a polymer compound (A) whose dispersity, weight-average molecular weight, and glass transition temperature are controlled such that they are within predetermined ranges due to this requirement for the formation of ultrafine patterns as described above (refer to JP2013-29554A) has been proposed.

SUMMARY OF THE INVENTION

On the other hand, in recent years, it has been required to attain higher pattern resolution and dry etching resistance.

The present inventors have found that when the properties of the chemical amplification type resist composition disclosed in JP2013-29554A are evaluated, the conventionally required levels thereof are met but the recently required levels thereof are not met, such that further improvements are required.

The present invention has been made in consideration of the above circumstances and an object thereof is to provide an actinic ray sensitive or radiation sensitive resin composition capable of forming a pattern which satisfies high resolution (for example, high resolving power, excellent pattern profile and low line edge roughness (LER)), and good dry etching resistance at a higher level at the same time, a resist film using the same, a resist-coated mask blank, a resist pattern forming method, and a photo mask.

As a result of intensive investigations of the problems of the related art, the present inventors have found that the above problems can be solved by using a polymer compound and a crosslinking agent exhibiting predetermined glass transition temperatures together.

That is, it has been found that the above object can be achieved by employing the following constitutions.

(1) An actinic ray sensitive or radiation sensitive resin composition comprising: a polymer compound (A) having a phenolic hydroxyl group and satisfying the following (a) and (b); a compound (B) capable of generating an acid upon irradiation with actinic rays or radiation; and a crosslinking agent (C) for crosslinking the polymer compound (A) by the action of an acid and having a glass transition temperature (Tg) of 200° C. or higher:

(a) the weight-average molecular weight is 3,000 or more and 6,500 or less, and (b) the glass transition temperature (Tg) is 140° C. or higher.

(2) The actinic ray sensitive or radiation sensitive resin composition according to (1), wherein the polymer compound (A) further satisfies the following (c):

(c) the dispersity (Mw/Mn) is 1.2 or less.

(3) The actinic ray sensitive or radiation sensitive resin composition according to (1) or (2), wherein the crosslinking agent (C) contains two or more crosslinking groups of at least one type selected from the group consisting of hydroxymethyl groups and alkoxymethyl groups, two or more benzene rings, and a cyclic aliphatic hydrocarbon group, and a ratio of the number of crosslinking groups to the number of benzene rings (that is, a ratio between the number of crosslinking groups and the number of benzene rings (number of crosslinking groups/number of benzene rings)) is 1.0 or less.

(4) The actinic ray sensitive or radiation sensitive resin composition according to any one of (1) to (3), wherein the polymer compound (A) has a repeating unit having a phenolic hydroxyl group, and a repeating unit having a group formed by substituting a hydrogen atom of a hydroxyl group in a phenolic hydroxyl group with a substituent.

(5) The actinic ray sensitive or radiation sensitive resin composition according to any one of (1) to (4), wherein the polymer compound (A) has a repeating unit represented by Formula (II), which will be described later, in an amount of 10 mol % to 90 mol % with respect to the all repeating units of the polymer compound (A).

(6) A resist film that is formed by using the actinic ray sensitive or radiation sensitive resin composition according to any one of (1) to (5).

(7) The resist film according to (6), wherein the film thickness thereof is 10 nm to 150 nm.

(8) A resist-coated mask blank comprising: a mask blank; and the resist film according to (6) or (7) which is formed on the mask blank.

(9) A resist pattern forming method comprising: exposing the resist film according to (6) or (7); and developing the exposed film.

(10) A resist pattern forming method comprising: exposing the resist-coated mask blank according to (8); and developing the exposed mask blank.

(11) The resist pattern forming method according to (9) or (10), wherein the exposure is performed using an electron beam or extreme-ultraviolet rays.

(12) A photo mask that is obtained by exposing and developing the resist-coated mask blank according to (8).

According to the present invention, it is possible to provide an actinic ray sensitive or radiation sensitive resin composition capable of forming a pattern which satisfies high resolution (for example, high resolving power, excellent pattern profile, and low line edge roughness (LER)), and good dry etching resistance at a higher level at the same time, a resist film using the same, a resist-coated mask blank, a resist pattern forming method, and a photo mask.

DESCRIPTION OF THE PREFERRED EMBODIMENTS

Hereinafter, embodiments of the present invention will be will be described.

In the present specification, when a group (atomic group) is denoted without specifying whether substituted or unsubstituted, the group includes not only a group having no substituent but also a group having a substituent. For example, the term "an alkyl group" includes not only an alkyl group having no substituent (an unsubstituted alkyl group) but also an alkyl group having a substituent (a substituted alkyl group).

In addition, in the present invention, the term "actinic rays" or "radiation" means, for example, a bright line spectrum of a mercury lamp, far ultraviolet rays typified by an excimer laser, extreme ultraviolet rays (EUV light), X-rays or an electron beam, and the like. Also, in the present invention, the term "light" means actinic rays or radiation. Furthermore, in the present specification, unless otherwise specified, the term "exposure" includes not only exposure to a mercury lamp, far ultraviolet rays typified by an excimer laser, X-rays, EUV light, and the like but also lithography with a particle beam such as an electron beam and an ion beam.

In the present specification, "A to B" means that it includes numerical values designated by "A" and "B" as a lower limit and an upper limit, respectively.

One characteristic of the present invention is to use a polymer compound (A) whose glass transition temperature has a predetermined value or more together with a crosslinking agent (C) whose glass transition temperature has a predetermined value or more, as described above.

It is considered that due to the polymer compound (A) satisfying (a), which will be described later, that is, due to the polymer compound having a weight-average molecular weight of 3,000 or more, sufficient dry etching resistance is imparted, and due to the polymer compound having a weight-average molecular weight of 6,500 or less, the dissolution unit of the polymer compound (A) dissolved in a developing solution becomes small in the unexposed area and this contributes to improvement of the resolution.

In addition, due to the polymer compound (A) and the crosslinking agent (C) exhibiting predetermined glass transition temperatures, Tg of a resist film to be formed itself increases and the mobility of molecules constituting the resist film decreases, so that an acid generated by exposure can be prevented from diffusing into the unexposed area. As a result, a pattern having high resolution can be obtained. In addition, the obtained resist film becomes very hard. Thus, the dry etching resistance is improved and the obtained pattern is less likely to collapse, which is considered to also contribute to improvement of the resolution.

Furthermore, due to the polymer compound (A) satisfying (c), which will be described later, high sensitivity can be achieved in pattern formation. This is considered that because of the low dispersity, the amount of the low molecular weight component having a high dissolution rate for an alkali developing solution can be decreased in the polymer compound (A), as a result, the dissolution rate of the exposed area for an alkali developing solution can be reduced.

Hereinafter, an actinic ray sensitive or radiation sensitive resin composition of the present invention (hereinafter, also referred to as a "composition" or "composition of the present invention") will be described.

The composition of the present invention is mainly a chemical amplification type negative resist composition used for negative development (development where the exposed area remains as a pattern and the unexposed area is removed).

The composition of the present invention includes at least the polymer compound (A), which will be described later, a compound (B) capable of generating an acid upon irradiation with actinic rays or radiation; and a crosslinking agent (C) having a glass transition temperature (Tg) of 200° C. or higher. Various types of components included in the composition will be described in detail below.

In the following description, first, the crosslinking agent (C) which is one characteristic of the present invention will be described in detail.

<Crosslinking Agent (C)>

The crosslinking agent (C) is a compound for crosslinking the polymer compound (A) by the action of an acid and has a glass transition temperature (Tg) of 200° C. or higher. The molecules of the polymer compound, which will be described later, can be crosslinked by using the crosslinking agent.

The glass transition temperature of the crosslinking agent (C) is 200° C. or higher and from the viewpoint that a pattern exhibiting higher resolution (for example, high resolving power, excellent pattern profile and small line edge roughness (LER)), and/or better dry etching resistance can be formed (hereinafter, also simply referred to as "from the viewpoint of further enhancing the effect of the present invention"), the glass transition temperature of the crosslinking agent is preferably 220° C. or higher. The upper limit is not particularly limited but typically is 350° C. or lower in many cases. The upper limit is preferably 300° C. or lower.

In the case in which the glass transition temperature is lower than 200° C., at least either of the resolution or the dry etching resistance deteriorates.

The glass transition temperature (Tg) is obtained from an inflection point when a differential scanning calorimeter (DSC), Q2000, manufactured by TA Instruments, is used and after weighing a vacuum-dried polymer sample (about 2 mg) in an aluminum pan and setting the aluminum pan on the DSC measurement holder, the temperature is raised to 10° C. to 200° C. at 2° C./min. In the case in which the inflection point of the DTA curve corresponding to the glass transition temperature up to 200° C. is not observed, it is determined that Tg is 200° C. or higher.

The crosslinking agent (C) has a crosslinking group which reacts with the polymer compound (A) by the action of an acid. The type of the crosslinking group is not particularly limited and examples thereof include a hydroxymethyl group, an alkoxymethyl group, or the like. The alkoxymethyl group is preferably a methoxymethyl group or an ethoxymethyl group.

The number of crosslinking group is not particularly limited and is typically two or more crosslinking groups. From the viewpoint of further enhancing the effect of the present invention, the number of crosslinking groups is preferably 4 to 8 and more preferably 4.

The molecular weight of the crosslinking agent (C) is not particularly limited but from the viewpoint of further enhancing the effect of the present invention, the molecular weight of the crosslinking agent is preferably 500 to 2,000 and more preferably 600 to 1,200.

Examples of the crosslinking agent (C) include hydroxymethylated or alkoxymethylated phenol compounds, alkoxymethylated melamine-based compounds, alkoxymethyl glycoluril-based compounds, and alkoxymethylated urea-based compounds.

From the viewpoint of further enhancing the effect of the present invention, a preferable embodiment of the crosslinking agent (C) is a crosslinking agent X including two or more crosslinking groups of at least one type selected from the group consisting of hydroxymethyl groups and alkoxymethyl groups, and two or more benzene rings in the molecule and having a ratio of the number of crosslinking groups to the number of benzene rings (that is, a ratio between the number of crosslinking groups and the number of benzene rings (number of crosslinking groups/number of benzene rings)) of 1.0 or less.

The number of benzene rings in the crosslinking agent X may be 2 or more but from the viewpoint of further enhancing the effect of the present invention, the number of benzene rings is preferably 2 to 8 and more preferably 4 to 6.

The number of crosslinking groups in the crosslinking agent X may be 2 or more but from the viewpoint of further enhancing the effect of the present invention, the number of crosslinking groups is preferably 2 to 8 and more preferably 4 to 6.

The ratio in the crosslinking agent X (number of crosslinking groups/number of benzene rings) may be 1.0 or less but from the viewpoint of further enhancing the effect of the present invention, the ratio is preferably 0.1 to 1.0 and more preferably 0.5 to 0.8.

In addition, from the viewpoint of further enhancing the effect of the present invention, it is preferable that the crosslinking agent X further includes a cyclic aliphatic hydrocarbon group (for example, a cyclohexane ring group). The number of cyclic aliphatic hydrocarbon groups in the molecule is not particularly limited but from the viewpoint of further enhancing the effect of the present invention, the number of cyclic aliphatic hydrocarbon groups is preferably 2 or more and more preferably 4 to 8.

As a preferable embodiment of the crosslinking agent (C), a crosslinking agent represented by the following Formula (A) or (B) can be mentioned.

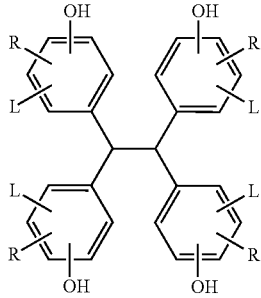

Formula (A)

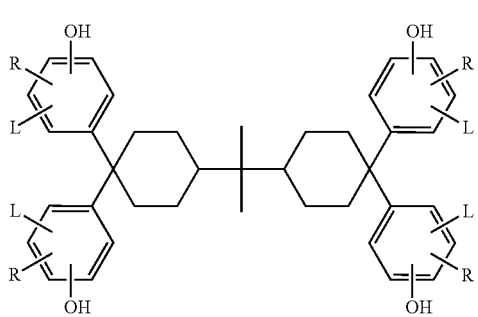

Formula (B)

In Formula (A), Rs each independently represent an aliphatic hydrocarbon group. The aliphatic hydrocarbon group may be chained (chained aliphatic hydrocarbon group) and may be cyclic (cyclic aliphatic hydrocarbon group). A cyclic group (particularly, a cyclohexyl group is preferable) is preferable. The above "chained" group includes both a linear group and a branched group.

The number of carbon atoms in the aliphatic hydrocarbon group is not particularly limited but from the viewpoint of further enhancing the effect of the present invention, the number of carbon atoms is preferably 3 to 12 and more preferably 6 to 10.

In Formula (A), Ls each independently represent a hydroxymethyl group or an alkoxymethyl group.

However, in the case in which R is a chained aliphatic hydrocarbon group, L represents an alkoxymethyl group.

In Formula (B), Rs each independently represent an aliphatic hydrocarbon group. The definition of the aliphatic hydrocarbon group and a preferable embodiment thereof are as described above.

In Formula (B), Ls each independently represent a hydroxymethyl group or an alkoxymethyl group.

The content of the crosslinking agent (C) in the composition is not particularly limited but is preferably 3% by mass to 65% by mass and more preferably 5% by mass to 50% by mass with respect to the total solid content in the composition. In the case in which the content of the crosslinking agent (C) is within the above range, the residual film ratio and the resolving power can be further prevented from being reduced and better stability of the resist solution can be kept during storage.

Incidentally, the solid content is intended to include components constituting the resist film and does not include a solvent.

The crosslinking agent (C) may be used alone or in combination of two or more.

In addition, the mass ratio between the crosslinking agent (C) and the polymer compound (A), which will be described later, (mass of crosslinking agent (C)/mass of polymer compound (A)) is not particularly limited but from the viewpoint of further enhancing the effect of the present invention, the ratio is preferably 0.1 to 10 and more preferably 0.2 to 5.

<Polymer Compound (A)>

The polymer compound (A) is a compound having a phenolic hydroxyl group and satisfying the following (a) and (b).

(a) The weight-average molecular weight is 3,000 or more and 6,500 or less.

(b) The glass transition temperature (Tg) is 140° C. or higher.

The phenolic hydroxyl group is a group formed by substituting a hydrogen atom of an aromatic ring group with a hydroxyl group. The aromatic ring is a monocyclic or polycyclic aromatic ring, and examples thereof include an aromatic hydrocarbon ring having 6 to 18 carbon atoms, which may have a substituent, such as a benzene ring, a naphthalene ring, an anthracene ring, a fluorene ring and a phenanthrene ring, and an aromatic heterocyclic ring containing a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among these, a benzene ring and a naphthalene ring are preferable from the viewpoint of resolution, and a benzene ring is most preferred.

The weight-average molecular weight of the polymer compound (A) is 3,000 or more and 6,500 or less, and from the viewpoint of further enhancing the effect of the present invention, the weight-average molecular weight is preferably 2,500 to 5,000 and more preferably 2,800 to 4,500.

The weight-average molecular weight of the polymer compound (A) is defined as a value in terms of polystyrene by GPC (solvent: THF, column: TSK gel Multipore HXL-M, manufactured by Tosoh Corporation, column temperature: 40° C., flow velocity: 1.0 mL/min, detector: RI) measurement.

The glass transition temperature (Tg) of the polymer compound (A) is 140° C. or higher and from the viewpoint of further enhancing the effect of the present invention, the glass transition temperature is preferably 145° C. or higher and more preferably 150° C. or higher. The upper limit of the glass transition temperature is not particularly limited and is typically 250° C. or lower and preferably 170° C. or lower.

The glass transition temperature (Tg) is obtained from an inflection point when a differential scanning calorimeter (DSC), Q2000, manufactured by TA Instruments, is used and after weighing a vacuum-dried polymer sample (about 2 mg) in an aluminum pan and setting the aluminum pan on the DSC measurement holder, the temperature is raised to 10° C. to 200° C. at 2° C./min. In the case in which the inflection point of the DTA curve corresponding to the glass transition temperature up to 200° C. is not observed, it is determined that Tg is 200° C. or higher.

From the viewpoint of higher sensitivity, it is preferable that the polymer compound (A) satisfies the following (c). Mw indicates the weight-average molecular weight of the polymer compound (A) (in terms of polystyrene) and Mn indicates the number average molecular weight of the polymer compound (A) (in terms of polystyrene). The dispersity may be measured by GPC measurement used when the above-mentioned weight-average molecular weight is measured.

(c) The dispersity (Mw/Mn) is 1.2 or less.

Within the range, from the viewpoint of higher sensitivity, the dispersity is preferably 1.05 to 1.18 and more preferably 1.10 to 1.16.

The structure of the polymer compound (A) is not particularly limited as long as the compound has a phenolic hydroxyl group and exhibits the predetermined properties. However, the polymer compound preferably contains a repeating unit having a phenolic hydroxyl group. The type of the repeating unit having a phenolic hydroxyl group is not particularly limited but the repeating unit is preferably a repeating unit represented by Formula (II) below.

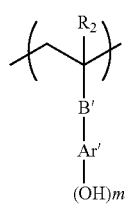

(II)

In the formula, $R_2$ represents a hydrogen atom, a methyl group which may have a substituent, or a halogen atom. B' represents a single bond or a divalent organic group. Ar' represents an aromatic ring group. m represents an integer of 1 or more.

Examples of the methyl group which may have a substituent in $R_2$ include a trifluoromethyl group and a hydroxymethyl group. $R_2$ is preferably a hydrogen atom or a methyl group, and preferably a hydrogen atom from the viewpoint of developability.

The divalent linking group of B' is preferably a carbonyl group, an alkylene group (preferably having 1 to 10 carbon atoms and more preferably 1 to 5 carbon atoms), a sulfonyl group (—S(=O)$_2$—), —O—, —NH—, or a divalent linking group formed by combining these. B' preferably represents a single bond, a carbonyloxy group (—C(=O)—O—), or —C(=O)—NH—, more preferably represents a single bond or a carbonyloxy group (—C(=O)—O—), and particularly preferably represents a single bond from the viewpoint of improving dry etching resistance.

The aromatic ring of Ar' is a monocyclic or polycyclic aromatic ring and examples thereof include an aromatic hydrocarbon ring having a carbon number of 6 to 18, which may have a substituent, such as benzene ring, naphthalene ring, anthracene ring, fluorene ring and phenanthrene ring, and an aromatic heterocyclic ring containing a heterocyclic ring such as thiophene ring, furan ring, pyrrole ring, benzothiophene ring, benzofuran ring, benzopyrrole ring, triazine ring, imidazole ring, benzimidazole ring, triazole ring, thiadiazole ring and thiazole ring. Among these, a benzene ring and a naphthalene ring are preferable from the viewpoint of resolution, and a benzene ring is most preferable from the viewpoint of sensitivity.

m is preferably an integer of 1 to 5 and most preferably 1. When m is 1 and Ar' is a benzene ring, the substitution position of —OH may be a para-position, a meta-position or an ortho-position with respect to the bonding position of the benzene ring to B' (the polymer main chain in the case in which B' is a single bond) but is preferably a para-position or a meta-position and more preferably a para-position, from the viewpoint of crosslinking reactivity.

The aromatic ring of Ar' may have a substituent other than the group represented by —OH above and examples of the substituent include an alkyl group, a cycloalkyl group, a halogen atom, a hydroxyl group, an alkoxy group, a carboxyl group, an alkoxycarboxyl group, an alkylcarbonyl group, an alkylcarbonyloxy group, an alkylsulfonyloxy group, and an arylcarbonyl group.

The repeating unit having a phenolic hydroxyl group is more preferably a repeating unit represented by Formula (2) below from the viewpoint of crosslinking reactivity, developability, and dry etching resistance.

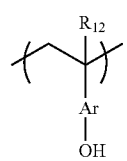

(2)

In Formula (2), $R_{12}$ represents a hydrogen atom or a methyl group. Ar represents an aromatic ring.

$R_{12}$ represents a hydrogen atom or a methyl group and preferably represents a hydrogen atom from the viewpoint of developability.

In Formula (2), Ar is the same as Ar' in Formula (II) above and the preferable range thereof is the same as Ar' in Formula (II) above. The repeating unit represented by Formula (2) is preferably a repeating unit induced from hydroxystyrene (that is, a repeating unit in which $R_{12}$ in Formula (2) represents a hydrogen atom and Ar represents a benzene ring) from the viewpoint of sensitivity.

The polymer compound (A) may be composed of only the repeating unit having a phenolic hydroxyl group as described above and may have a repeating unit other than the above repeating unit. In this case, the content of the repeating unit having a phenolic hydroxyl group is preferably 10 mol % or more, more preferably 30 mol % or more, and still more preferably 40 mol % or more with respect to the all repeating units in the polymer compound (A). Also, the content of the repeating unit is preferably 98 mol % or less, more preferably 97 mol % or less, still more preferably 95 mol % or less, and particularly preferably 90 mol % or less. Thus, particularly, in the case in which the resist film is thin (for example, the case in which the thickness of the resist film is 10 nm to 150 nm), the dissolution rate of the exposed area in the resist film for an alkali developing solution can be more reliably reduced (that is, the dissolution rate of the resist film using the polymer compound (A) can be more reliably controlled to an optimal dissolution rate). As a result, the sensitivity can be more reliably improved.

Hereinafter, examples of the repeating unit having a phenolic hydroxyl group will be shown but the repeating unit is not limited thereto.

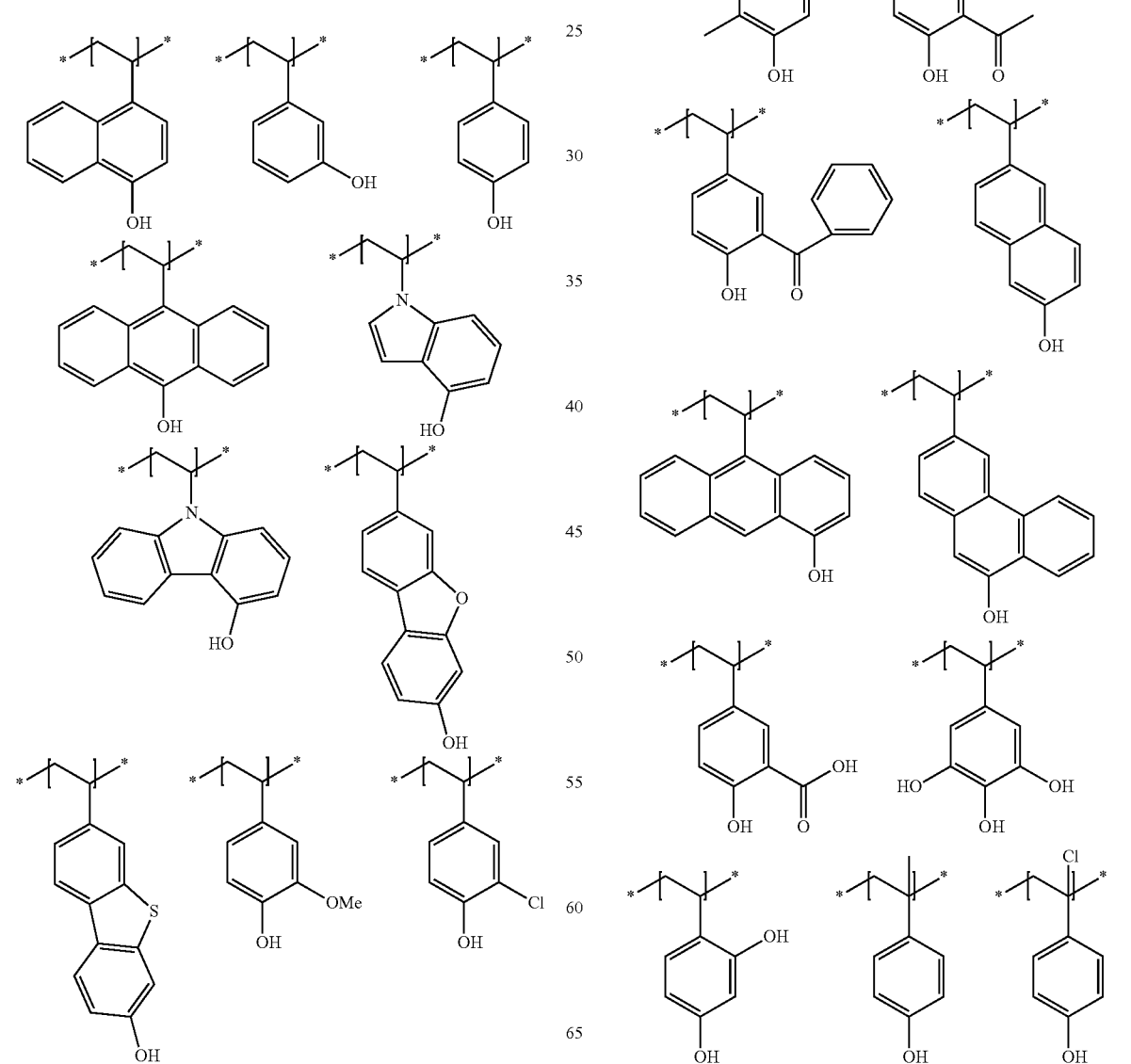

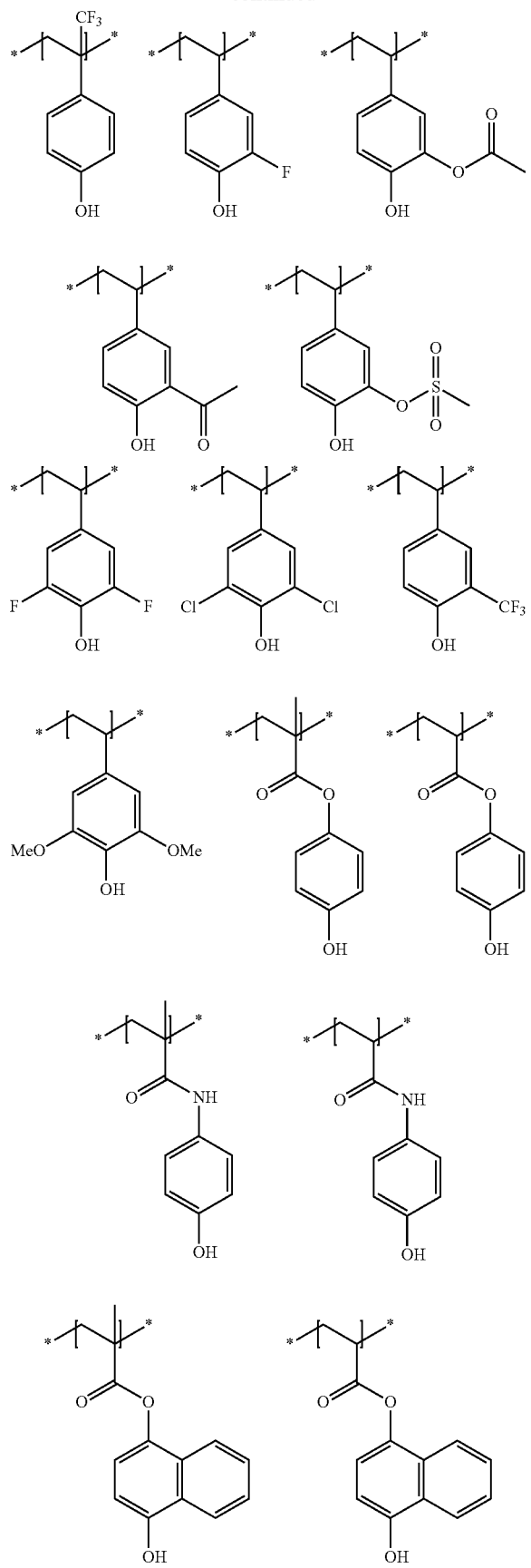
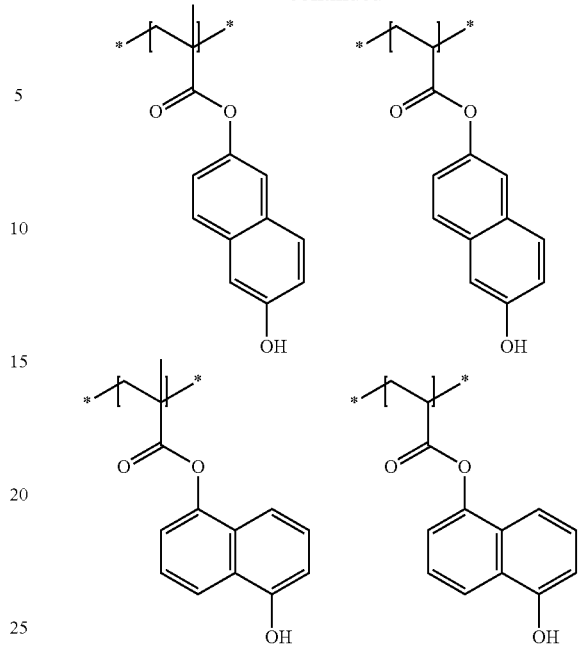

The polymer compound (A) may have a repeating unit other than the above repeating unit having a phenolic hydroxyl group and preferably has a repeating unit having a "group formed by substituting the hydrogen atom of the hydroxyl group in the phenolic hydroxyl group with a substituent" (hereinafter, also referred to as a repeating unit X).

The substituent in the "group formed by substituting the hydrogen atom of the hydroxyl group in the phenolic hydroxyl group with a substituent" is preferably a group having a cyclic hydrocarbon group. The total number of carbon atoms in the group having a cyclic hydrocarbon group is preferably 5 to 40 and more preferably 7 to 30.

The cyclic hydrocarbon group may be monocyclic or polycyclic. The monocyclic hydrocarbon group is preferably a cycloalkyl group having 3 to 8 carbon atoms or an aryl group having 6 to 8 carbon atoms, and examples thereof include a cyclopropyl group, a cyclopentyl group, a cyclohexyl group, a cyclobutyl group, a cyclooctyl group, and a phenyl group. The structure of the polycyclic hydrocarbon group includes a bicycle structure, a tricyclo structure or a tetracyclo structure each having 5 or more carbon atoms and a polycyclic cyclo group and a polycyclic aromatic group each having 6 to 30 carbon atoms are preferable. Examples thereof include an indene group, a fluorene group, an acenaphthylene group, an adamantyl group, a decalin group, a norbornyl group, an isobornyl group, a camphanyl group, a dicyclopentyl group, an α-pinel group, a tricyclodecanyl group, a tetracyclododecyl group, an androstanyl group, a naphthyl group, an anthracenyl group and a biphenyl group. Incidentally, some of carbon atoms in the monocyclic or polycyclic hydrocarbon group may be substituted with a heteroatom such as oxygen atom.

As a preferable structure of the cyclic hydrocarbon group, an indene group, a fluorene group, an acenaphthylene group, a naphthyl group, an adamantyl group, a decalin group, a norbornyl group, an isobornyl group, a camphanyl group and a dicyclopentyl group are mentioned, and an adamantyl group is most preferable from the viewpoint of dry etching resistance. Furthermore, the cyclic hydrocarbon group may further have a substituent and examples of the further substituent include an alkyl group, an aryl group, a halogen atom, a hydroxyl group, an alkoxy group, a carboxyl group, and an alkoxycarbonyl group.

A preferable embodiment of the repeating unit having the "group formed by substituting the hydrogen atom of the hydroxyl group in the phenolic hydroxyl group with a substituent" is a repeating unit represented by Formula (3) below.

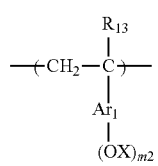

(3)

In Formula (3), $R_{13}$ represents a hydrogen atom or a methyl group. $Ar_1$ represents an aromatic ring.

X represents a group having a cyclic hydrocarbon group. m2 is an integer of 1 or more.

$R_{13}$ in Formula (3) represents a hydrogen atom or a methyl group but particularly preferably represents a hydrogen atom.

Examples of the aromatic ring of $Ar_1$ in Formula (3) include an aromatic hydrocarbon ring having 6 to 18 carbon atoms, which may have a substituent, such as a benzene ring, a naphthalene ring, an anthracene ring, a fluorene ring and a phenanthrene ring, and an aromatic heterocyclic ring containing a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among these, a benzene ring and a naphthalene ring are preferable from the viewpoint of resolution, and a benzene ring is most preferred.

The aromatic ring of $Ar_1$ have a substituent other than the group represented by —OX and examples of the substituent include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxyl group, and an alkoxycarbonyl group (preferably having 2 to 7 carbon atoms). Among these, an alkyl group, an alkoxy group and an alkoxycarbonyl group are preferable, and an alkoxy group is more preferable.

X represents a group having a cyclic hydrocarbon group. Specific examples and a preferable range of the cyclic hydrocarbon group in X are the same as described above. X more preferably represents a group represented by —Y—$X_2$ in Formula (4), which will be described later.

m2 is preferably an integer of 1 to 5 and most preferably 1. When m2 is 1 and $Ar_1$ is a benzene ring, the substitution position of —OX may be a para-position, a meta-position or an ortho-position with respect to the bonding position of the benzene ring to the polymer main chain but is preferably a para-position or a meta-position and more preferably a para-position.

In the present invention, the repeating unit represented by Formula (3) is preferably a repeating unit represented by Formula (4) below.

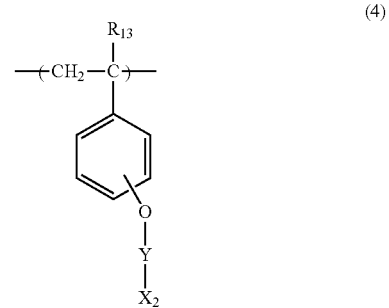

In Formula (4), $R_{13}$ preferably represents a hydrogen atom or a methyl group. Y represents a single bond or a divalent linking group. $X_2$ represents a cyclic hydrocarbon group.

In Formula (4), $R_{13}$ represents a hydrogen atom or a methyl group but particularly preferably represents a hydrogen atom.

In Formula (4), Y is preferably a divalent linking group. The divalent linking group of Y is preferably a carbonyl group, a thiocarbonyl group, an alkylene group (preferably having 1 to 10 carbon atoms and more preferably 1 to 5 carbon atoms), a sulfonyl group, —COCH$_2$—, —NH—, or a divalent linking group formed by combining these (preferably having a total carbon number of 1 to 20 carbon atoms and more preferably having a total carbon number of 1 to 10), more preferably a carbonyl group, —COCH$_2$—, a sulfonyl group, —CONH—, or —CSNH—, still more preferably a carbonyl group or —COCH$_2$—, and particularly preferably a carbonyl group.

$X_2$ represents a cyclic hydrocarbon group. Specific examples and a preferable range of the cyclic hydrocarbon group is the same as described above.

In Formula (4), the substitution position of —O—Y—$X_2$ may be a para-position, a meta-position or an ortho-position with respect to the bonding position of the benzene ring to the polymer main chain but is preferably a para-position.

In the present invention, the repeating unit represented by Formula (3) is most preferably a repeating unit represented by Formula (4') below.

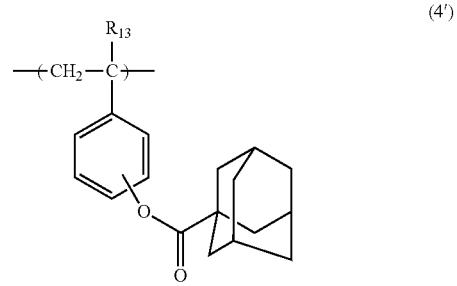

In Formula (4'), $R_{13}$ represents a hydrogen atom or a methyl group.

In Formula (4'), $R_{13}$ represents a hydrogen atom or a methyl group and particularly preferably represents a hydrogen atom.

In Formula (4'), the substitution position of an adamantyl ester group may be a para-position, a meta-position or an ortho-position with respect to the bonding position of the benzene ring to the polymer main chain but is preferably a para-position.

Specific examples of the repeating unit represented in Formula (3) include the followings.
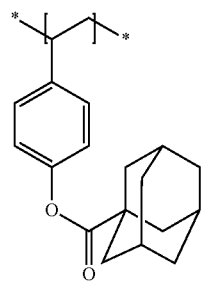 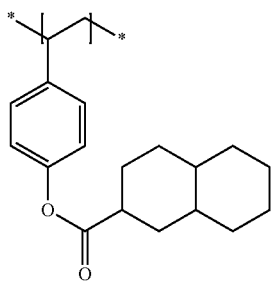
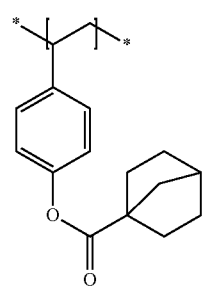 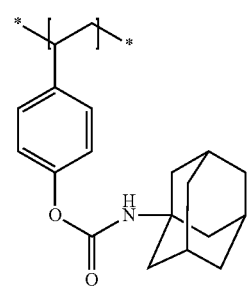
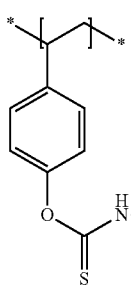 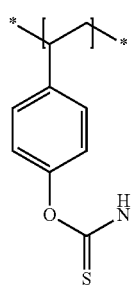
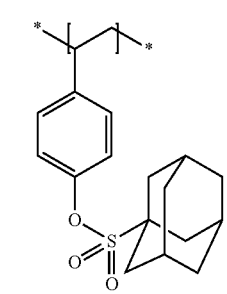 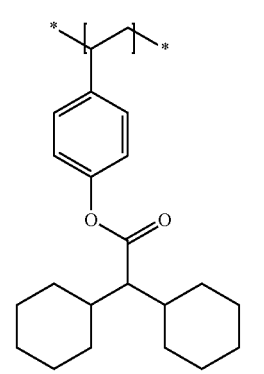
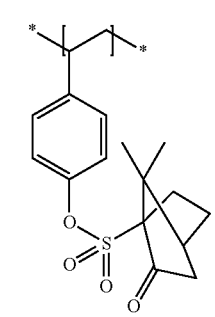 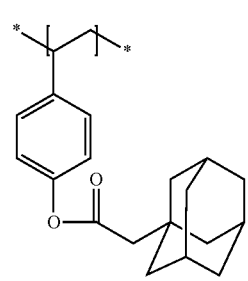
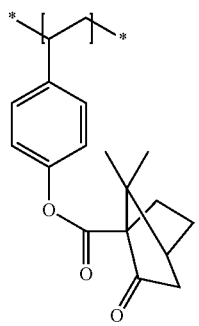 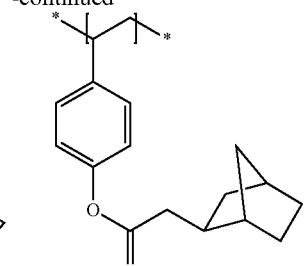
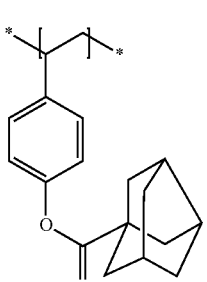 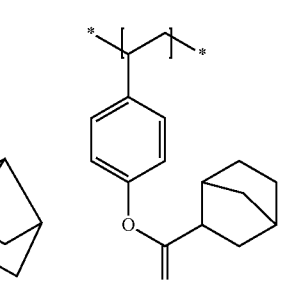
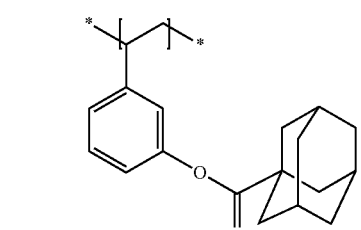
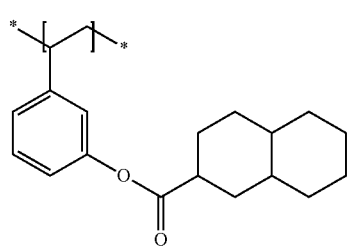
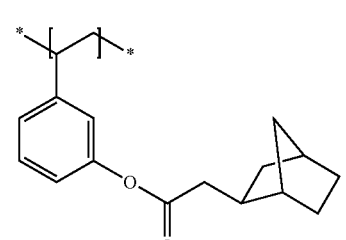
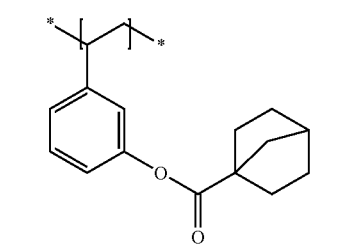

-continued
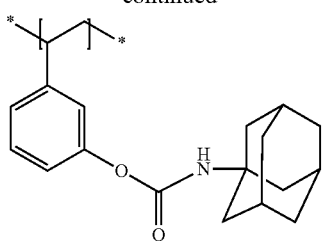
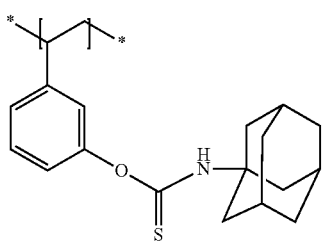
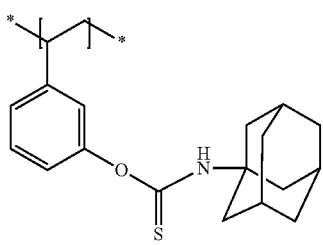
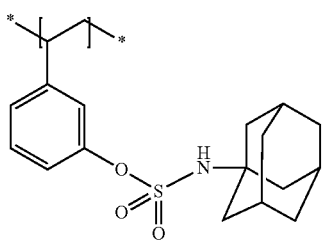
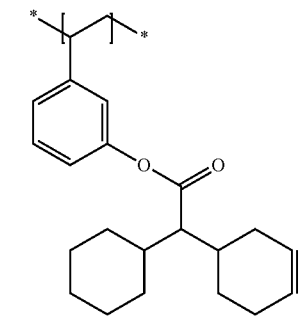
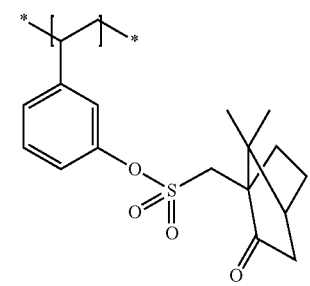
-continued
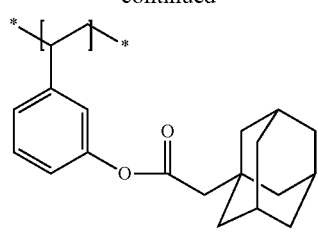
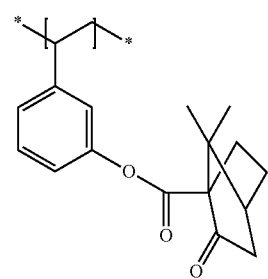
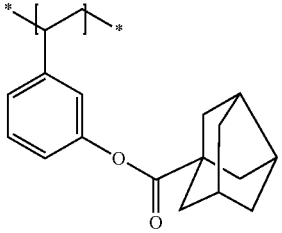
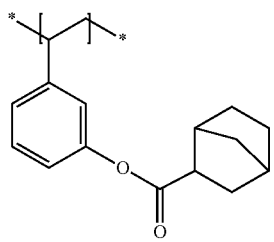
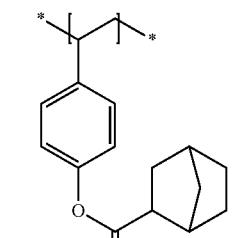
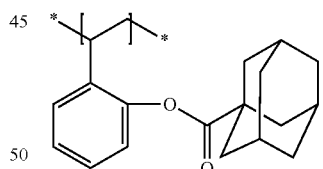
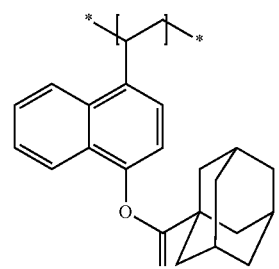
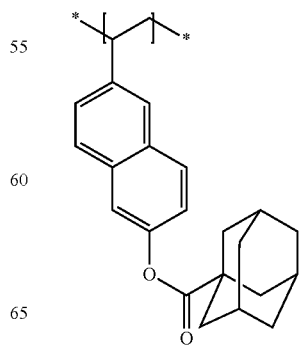
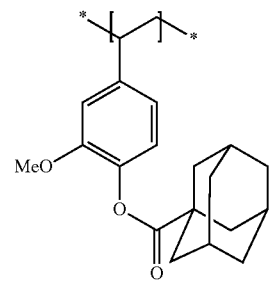

-continued

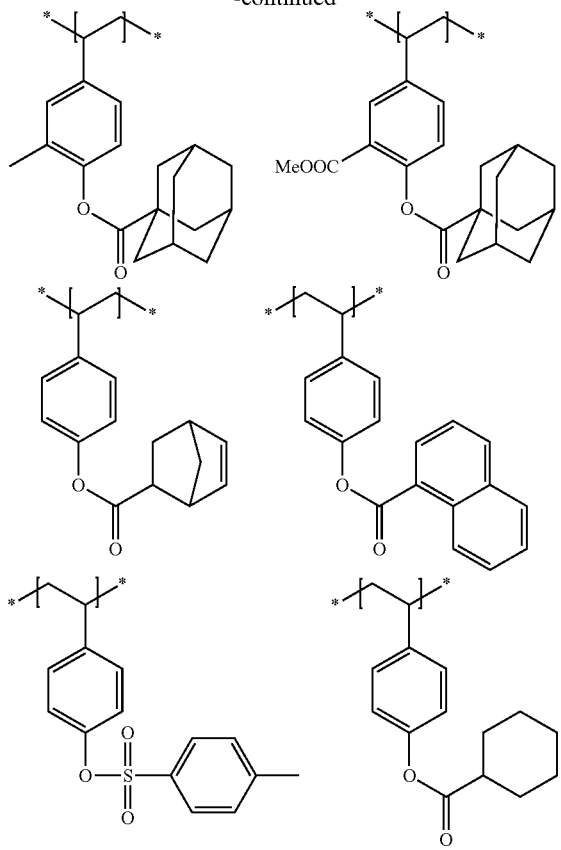

In the case in which the polymer compound (A) contains the repeating unit X, the content of the repeating unit X is preferably 1 mol % to 40 mol % and more preferably 2 mol % to 30 mol % with respect to the all repeating units of the polymer compound (A).

Examples of the polymerizable monomer for forming a repeating unit other than the above repeating unit X include styrene, alkyl substituted styrene, alkoxy substituted styrene, halogen substituted styrene, O-alkylated styrene, O-acylated styrene, hydrogenated hydroxy styrene, maleic anhydride, acrylic acid derivatives (acrylic acid, acrylic ester, and the like), methacrylic acid derivatives (methacrylic acid, methacrylic ester, and the like), N-substituted maleimide, acrylonitrile, methacrylonitrile, vinylnaphthalene, vinylanthracene, and indene which may have a substituent.

In the case in which the polymer compound (A) contains the repeating unit derived from the above polymerizable monomer, the content of the repeating unit is preferably 1 mol % to 30 mol %, more preferably 1 mol % to 20 mol %, and still more preferably 2 mol % to 10 mol % with respect to the all repeating units in the polymer compound (A).

The polymer compound (A) can be synthesized by a known radical polymerization method, anionic polymerization method, or living radical polymerization method (such as iniferter method). For example, in the anionic polymerization method, vinyl monomers are dissolved in an appropriate organic solvent and reacted typically under a cooling condition by using a metal compound (such as butyllithium) as the initiator, whereby the polymer can be obtained.

The content of the polymer compound (A) in the composition is not particularly limited but from the viewpoint of further enhancing the effect of the present invention, the content of the polymer compound is preferably 30% by mass to 95% by mass, more preferably 40% by mass to 90% by mass, and still more preferably 50% by mass to 85% by mass with respect to the total solid content in the composition.

<Compound (B) Capable of Generating Acid Upon Irradiation with Actinic Ray or Radiation>

The compound (B) (hereinafter, also referred to as a "compound (B)", "acid generator", or "photoacid generator") capable of generating an acid upon irradiation with an actinic ray or radiation can be formed by using known materials. A preferable embodiment of the acid generator can be an onium salt compound. Examples of such an onium salt compound include a sulfonium salt, an iodonium salt, and a phosphonium salt.

In addition, another preferable embodiment of the acid generator can be a compound capable of generating a sulfonic acid, an imide acid, or a methide acid upon irradiation with an actinic ray or radiation. Examples of the acid generator in this embodiment include a sulfonium salt, an iodonium salt, a phosphonium salt, oxime sulfonate, and imidosulfonate.

The acid generator is preferably a compound capable of generating an acid upon irradiation with an electron beam or extreme-ultraviolet rays.

In the present invention, the onium salt compound can be preferably a sulfonium compound represented by Formula (7) below or an iodonium compound represented by Formula (8) below.

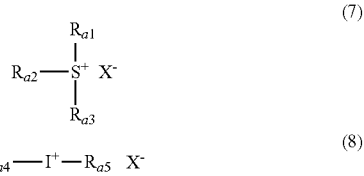

In Formula (7) and Formula (8), $R_{a1}$, $R_{a2}$, $R_{a3}$, $R_{a4}$, and $R_{a5}$ each independently represent an organic group. $X^-$ represents an organic anion.

Hereinafter, the sulfonium compound represented by Formula (7) and the iodonium compound represented by Formula (8) are further described in detail.

$R_{a1}$, $R_{a2}$, and $R_{a3}$ in Formula (7) and $R_{a4}$ and $R_{a5}$ in Formula (8) each independently represent an organic group as described above and at least one of $R_{a1}$, $R_{a2}$, or $R_{a3}$ and at least one of $R_{a4}$ or $R_{a5}$ are preferably an aryl group, respectively. The aryl group is preferably a phenyl group or a naphthyl group and is more preferably a phenyl group.

Examples of the organic anion of $X^-$ in Formulae (7) and (8) include a sulfonate anion, a carboxylate anion, a bis(alkylsulfonyl)amide anion, and a tris(alkylsulfonyl)methide anion. The organic anion is preferably an organic anion represented by Formula (9), (10) or (11) below and more preferably an organic anion represented by Formula (9) below.

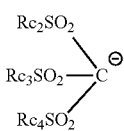

(11)

In Formulae (9), (10), and (11), $Rc_1$, $Rc_2$, $Rc_3$, and $Rc_4$ each independently represent an organic group.

The organic anion of $X^-$ corresponds to a sulfonic acid, an imide acid, or a methide acid which are an acid generated upon irradiation with an actinic ray or radiation such as an electron beam and extreme-ultraviolet rays.

Examples of the organic group of $Rc_1$, $Rc_2$, $Rc_3$, and $Rc_4$ include an alkyl group, an aryl group, and a group formed by combining a plurality of such groups. Among these organic groups, an alkyl group substituted with a fluorine atom or a fluoroalkyl group at the 1-position, and a phenyl group substituted with a fluorine atom or a fluoroalkyl group, are more preferable. By having a fluorine atom or a fluoroalkyl group, the acidity of the acid generated by light irradiation is increased and the sensitivity is improved. However, the terminal group preferably contains no fluorine atom as a substituent.

In the present invention, from the viewpoint of preventing the acid generated by exposure from diffusing to the unexposed area and improving the resolution or pattern profile, the acid generator is preferably a compound capable of generating an acid of a size with a volume of 130 Å³ or more (more preferably a sulfonic acid), more preferably a compound capable of generating an acid of a size with a volume of 190 Å³ or more (more preferably a sulfonic acid), still more preferably a compound capable of generating an acid of a size with a volume of 270 Å³ or more (more preferably a sulfonic acid), and particularly preferably a compound capable of generating an acid of a size with a volume of 400 Å³ or more (more preferably a sulfonic acid). However, from the viewpoint of sensitivity or solubility in the coating solvent, the volume above is preferably 2,000 Å³ or less and more preferably 1,500 Å³ or less. The value of the volume above was determined using "WinMOPAC" produced by Fujitsu Limited. That is, first, the chemical structure of the acid in each compound is input, next, using this structure as an initial structure, the most stable steric conformation of each acid is determined by molecular force field calculation according to an MM3 method, and then, molecular orbital calculation using a PM3 method is performed with respect to the most stable steric conformation, whereby the "accessible volume" of each acid can be calculated.

A particularly preferable acid generator used in the present invention will be shown below. In some of these examples, the calculated value of volume (unit: Å³) is shown together. The calculated value obtained here is a volume value of an acid where a proton is bonded to the anion moiety.

(z1)

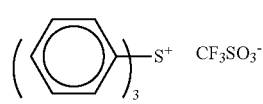

(z2)

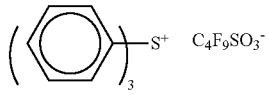

113 Å³

(z3)

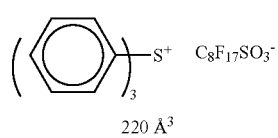

220 Å³

(z4)

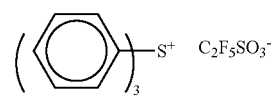

(z5)

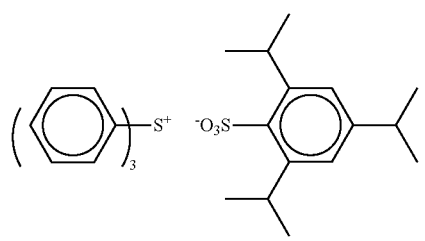

303 Å³

(z6)

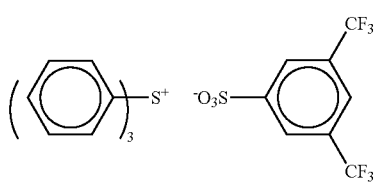

(z7)

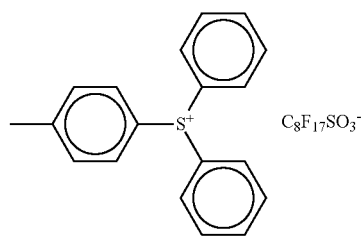

(z8)

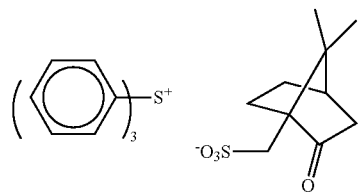

216 Å³

(z9)

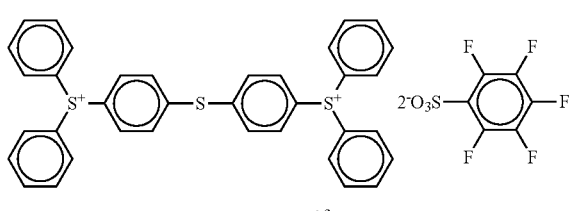

127 Å³

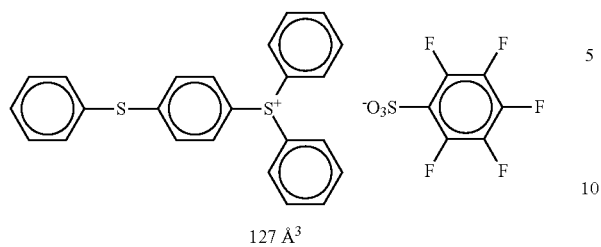
(z10)
127 Å³
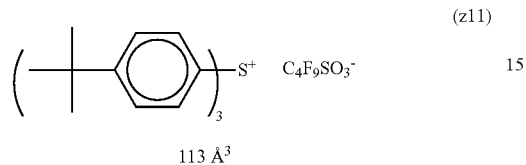
(z11)
113 Å³
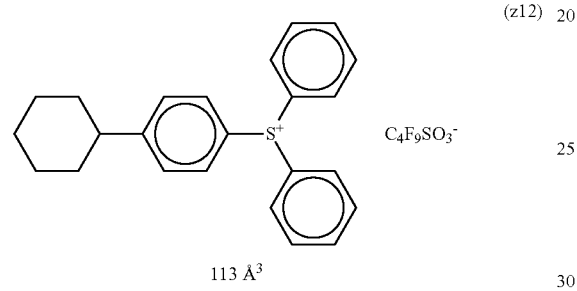
(z12)
113 Å³
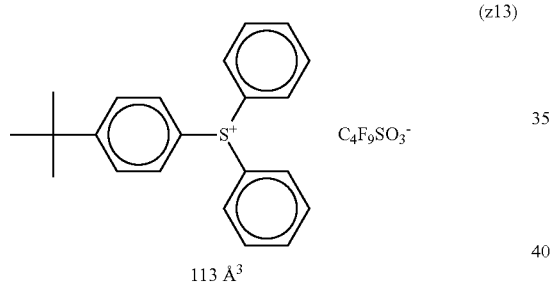
(z13)
113 Å³
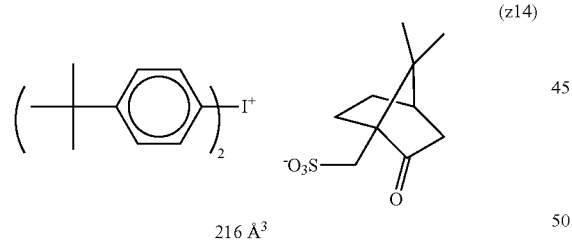
(z14)
216 Å³
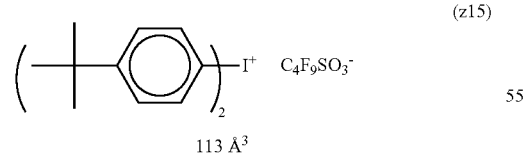
(z15)
113 Å³
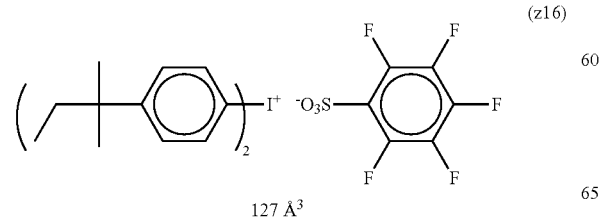
(z16)
127 Å³
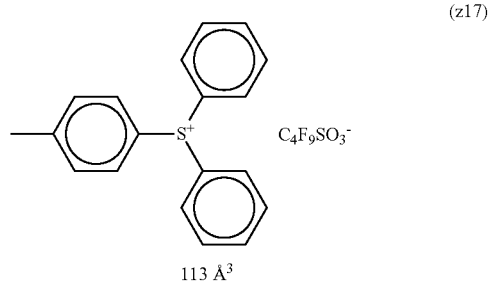
(z17)
113 Å³
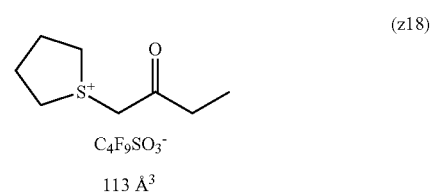
(z18)
$C_4F_9SO_3^-$
113 Å³
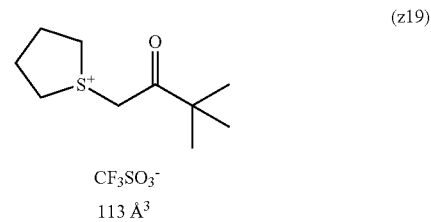
(z19)
$CF_3SO_3^-$
113 Å³
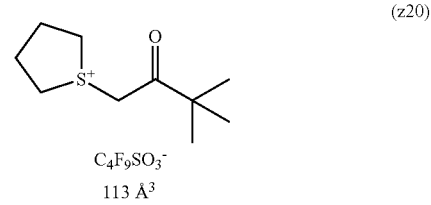
(z20)
$C_4F_9SO_3^-$
113 Å³
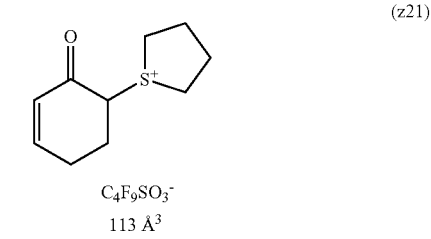
(z21)
$C_4F_9SO_3^-$
113 Å³
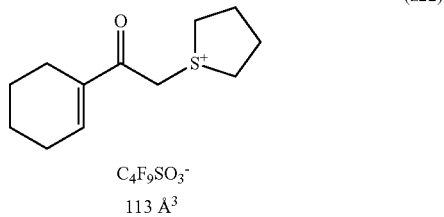
(z22)
$C_4F_9SO_3^-$
113 Å³
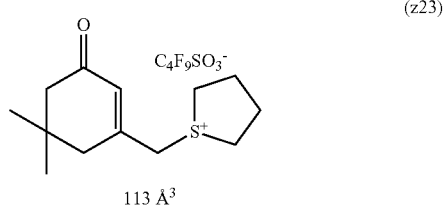
(z23)
$C_4F_9SO_3^-$
113 Å³

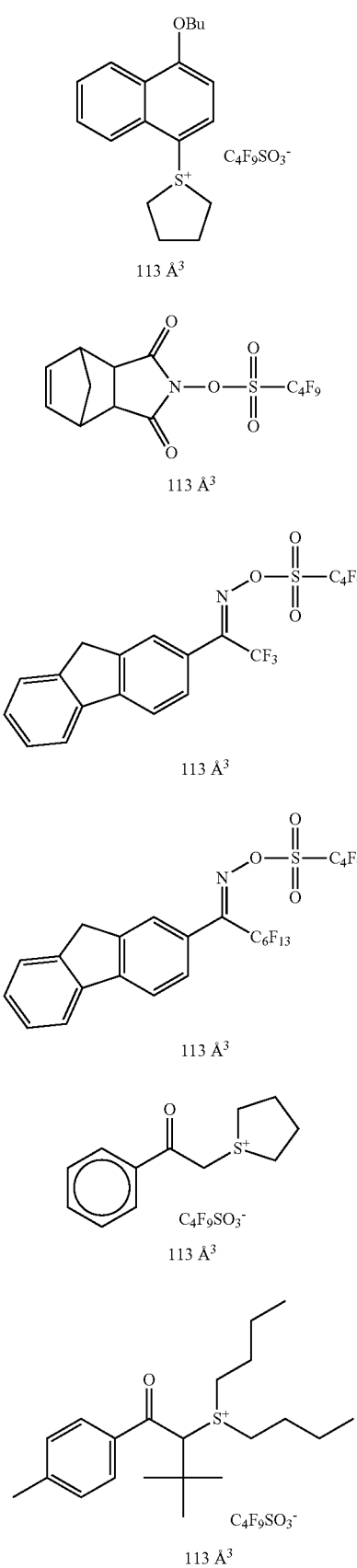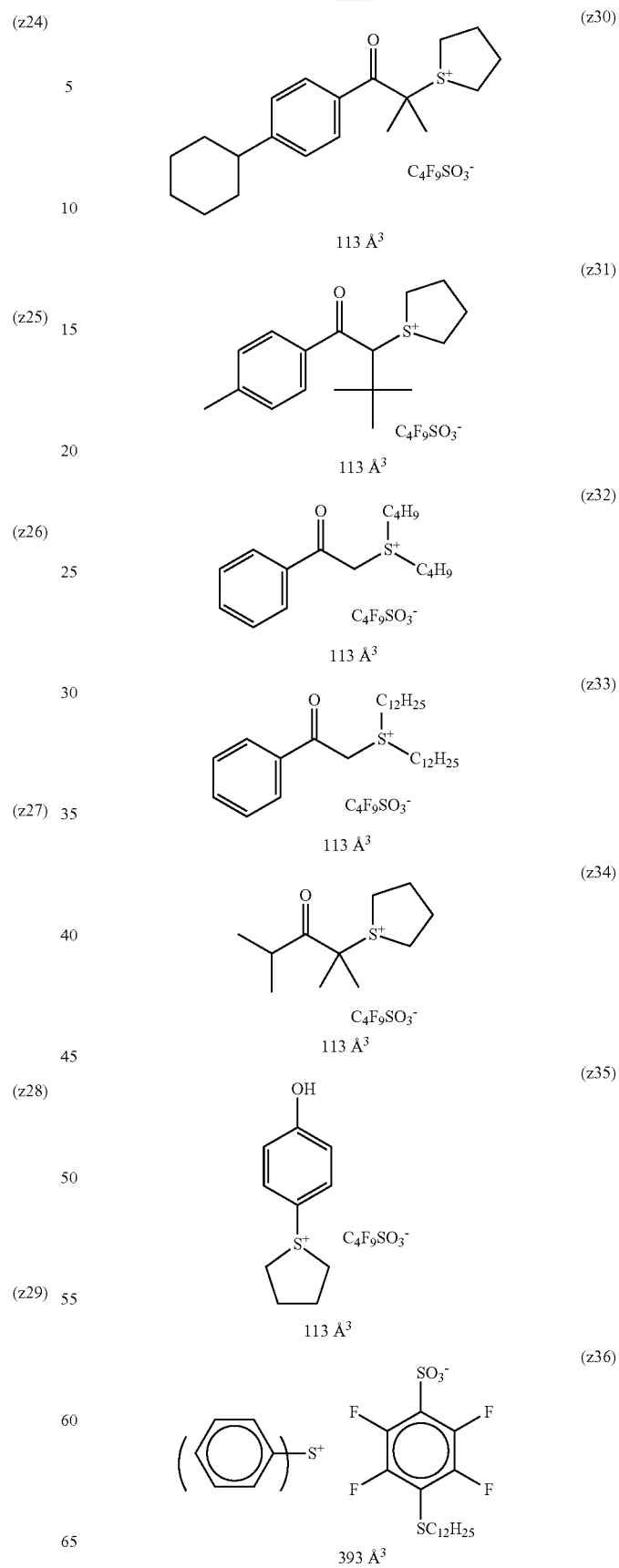

-continued
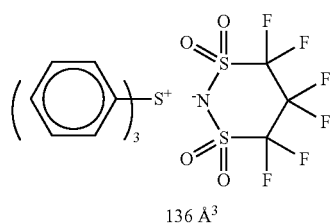
(z37)
136 Å³
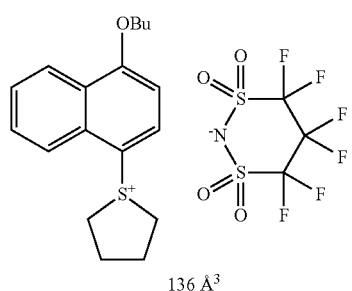
(z38)
136 Å³
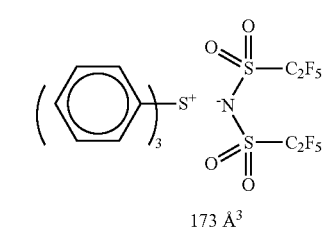
(z40)
173 Å³
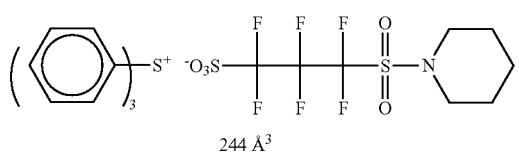
(z42)
244 Å³
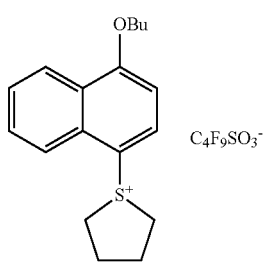
(z43)
113 Å³
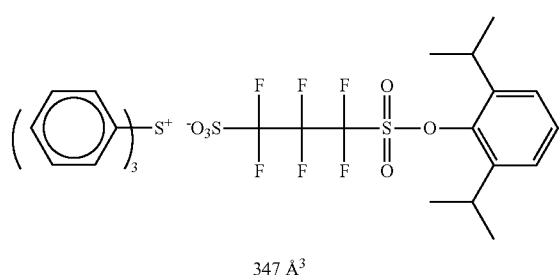
(z44)
347 Å³
-continued
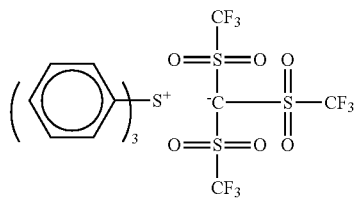
(z45)
189 Å³
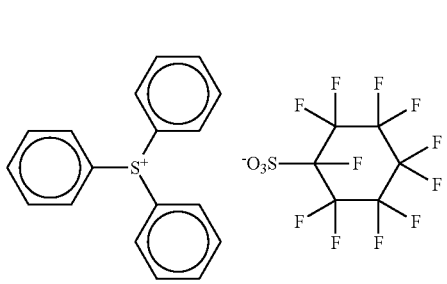
(z46)
136 Å³
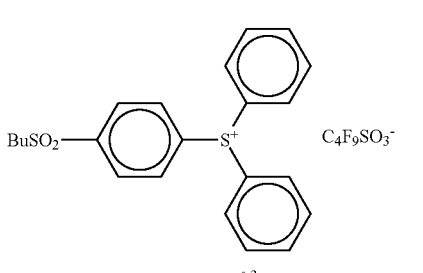
(z47)
113 Å³
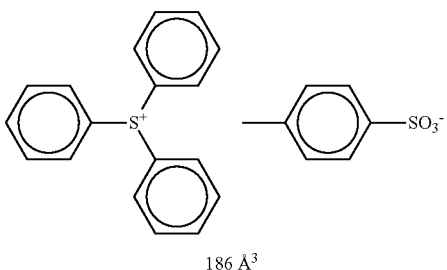
(z48)
186 Å³
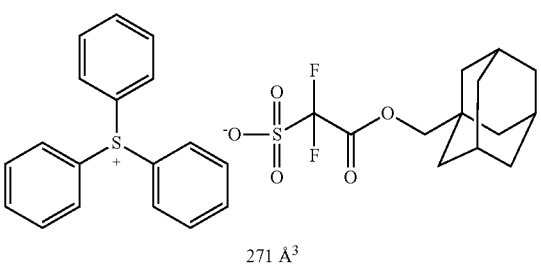
(z49)
271 Å³

(z50)
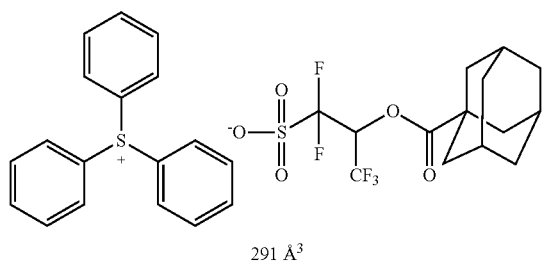
291 Å³
(z51)
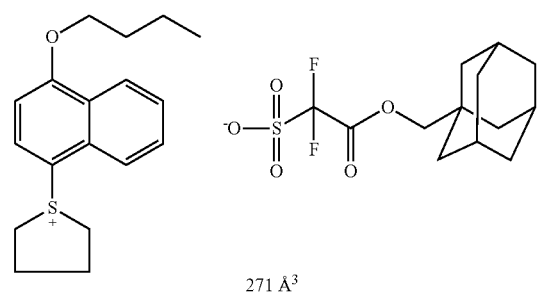
271 Å³
(z52)
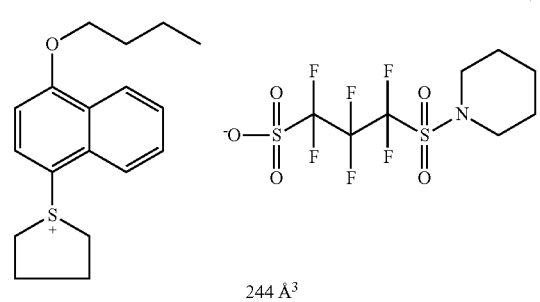
244 Å³
(z53)
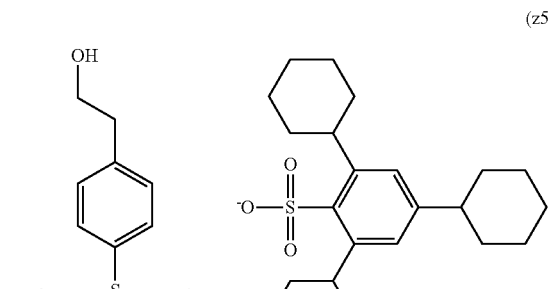
437 Å³
(z54)
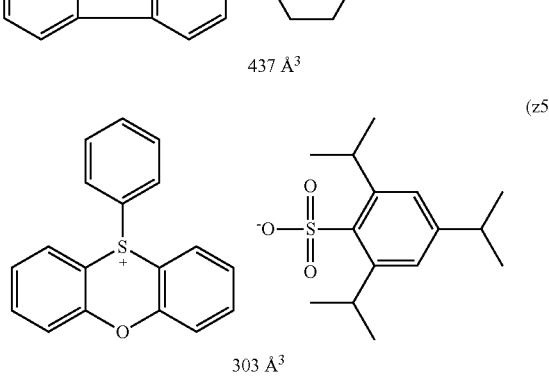
303 Å³
(z55)
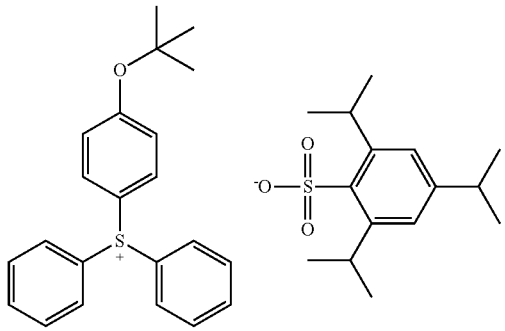
303 Å³
(z56)
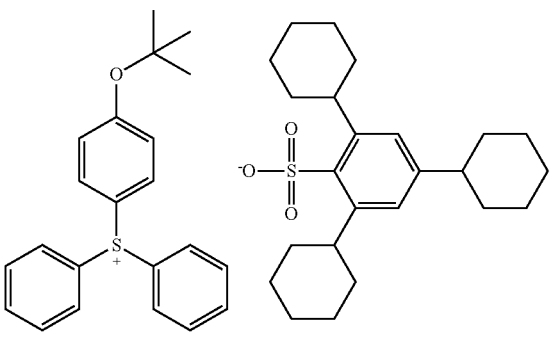
437 Å³
(z57)
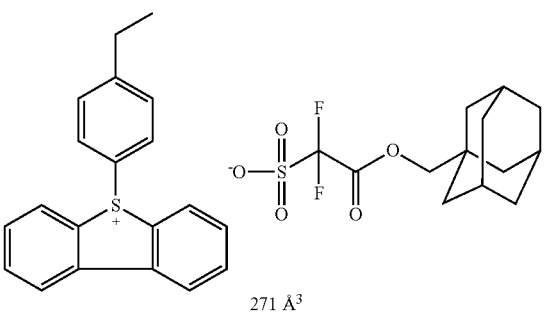
271 Å³
(z58)
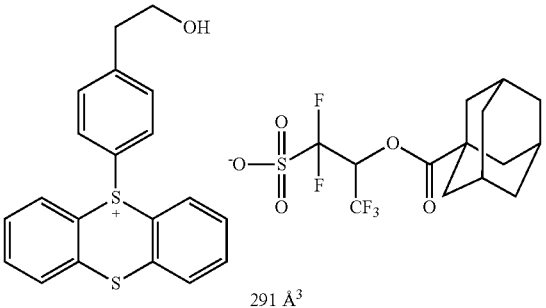
291 Å³

-continued
(z59)
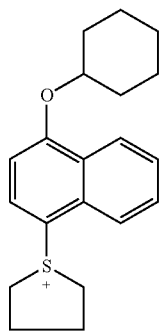
271 Å³
(z60)
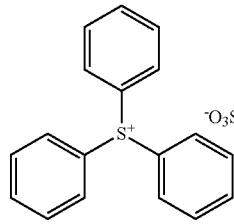
244 Å³
(z61)
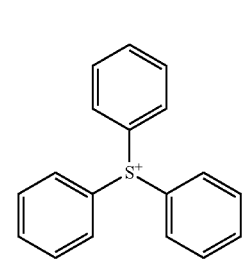
311 Å³
(z62)
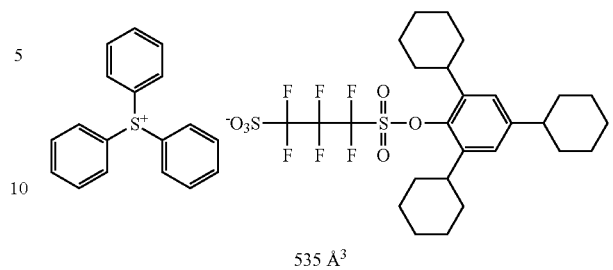
437 Å³
(z63)
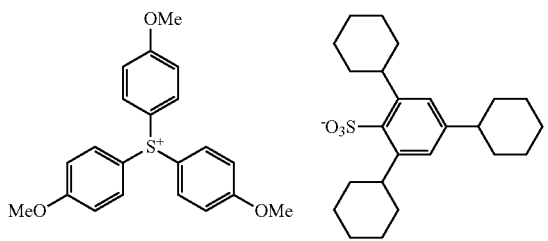
535 Å³
(z64)
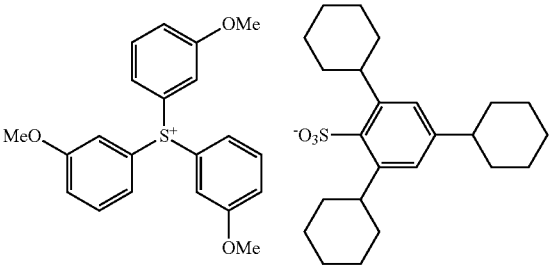
437 Å³
(z65)
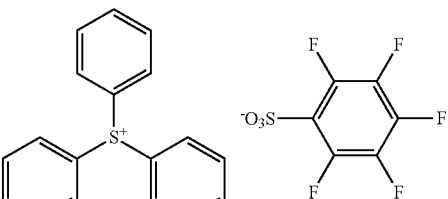
437 Å³
(z66)
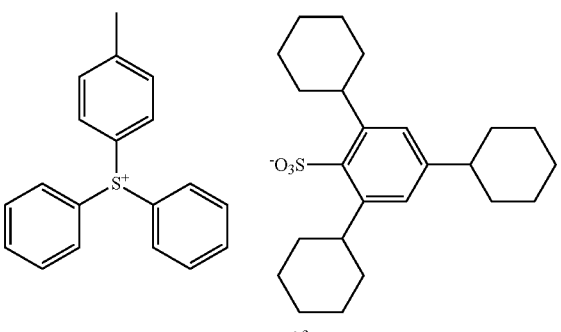
127 Å³
(z67)
437 Å³

-continued

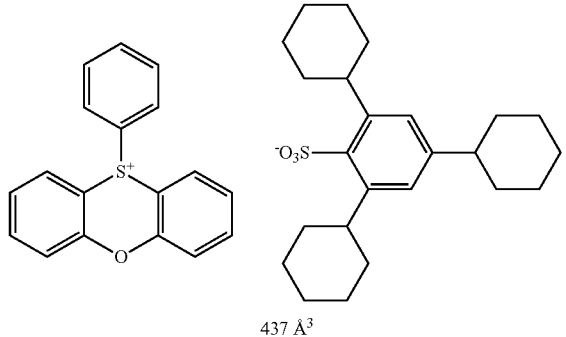

(z68)

437 Å³

In addition, as the acid generator (preferably an onium compound), a polymer-type acid generator where a group capable of generating an acid upon irradiation with an actinic ray or radiation (photoacid generating group) is introduced into the main or side chain of a polymer compound can be also used.

The content of the acid generator in the composition is preferably 0.1% by mass to 25% by mass, more preferably 0.5% by mass to 20% by mass, and still more preferably 1% by mass to 18% by mass with respect to the total solid content of the composition.

The acid generator may be used alone or in combination of two or more.

The composition may include components other than the above-mentioned components (the polymer compound (A), the compound (B) capable of generating an acid upon irradiation with an actinic ray or radiation, and the crosslinking agent (C)). Hereinafter, arbitrary components which may be included in the composition will be described in detail.

<Basic Compound>

It is preferable that the composition contains a basic compound as an acid scavenger. By using a basic compound, the change of performance with aging from exposure to post-heating can be reduced.

The basic compound is preferably an organic basic compound, and specific examples thereof include aliphatic amines, aromatic amines, heterocyclic amines, nitrogen-containing compounds having a carboxyl group, nitrogen-containing compounds having a sulfonyl group, nitrogen-containing compounds having a hydroxy group, nitrogen-containing compounds having a hydroxyphenyl group, alcoholic nitrogen-containing compounds, amide derivatives, and imide derivatives. An amine oxide compound (described in JP2008-102383A) and an ammonium salt (preferably a hydroxide or a carboxylate; more specifically, a tetraalkylammonium hydroxide typified by tetrabutylammonium hydroxide is preferable from the viewpoint of LER) may be also appropriately used.

Furthermore, a compound capable of increasing the basicity by the action of an acid can be also used as one basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline, triethanolamine, N,N-dihydroxyethylaniline, tris(methoxyethoxyethyl)amine, compounds exemplified in column 3, line 60 et seq. of U.S. Pat. No. 6,040,112A, 2-[2-{2-(2,2-dimethoxy-phenoxyethoxy)ethyl}bis-(2-methoxyethyl)]-amine, and Compounds (C1-1) to (C3-3) illustrated in paragraph [0066] of US2007/0224539A1. Examples of the compound having a nitrogen-containing heterocyclic structure include 2-phenylbenzimidazole, 2,4,5-triphenylimidazole, N-hydroxyethylpiperidine, bis(1,2,2,6,6-pentamethyl-4-piperidyl)sebacate, 4-dimethylaminopyridine, antipyrine, hydroxyantipyrine, 1,5-diazabicyclo[4.3.0]-non-5-ene, 1,8-diazabicyclo[5.4.0]-undec-7-ene, and tetrabutylammonium hydroxide.

In addition, a photodecomposable basic compound (a compound which initially exhibits basicity due to the action of a basic nitrogen atom as a base but decomposes upon irradiation with an actinic ray or radiation to generate a zwitterionic compound having a basic nitrogen atom and an organic acid moiety and resulting from their neutralization in the molecule, is reduced in or deprived of the basicity; for example, onium salts described in JP3577743B, JP2001-215689A, JP2001-166476A and JP2008-102383A), and a photobase generator (for example, compounds described in JP2010-243773A) may be also appropriately used.

Among these basic compounds, from the viewpoint of improving resolution, an ammonium salt is preferable.

In the case in which the composition of the present invention contains a basic compound, the content thereof is preferably 0.01% by mass to 10% by mass, more preferably 0.03% by mass to 5% by mass, and particularly preferably 0.05% by mass to 3% by mass with respect to the total solid content of the composition.

<Surfactant>

The composition of the present invention may contain a surfactant so as to improve the coatability.

The surfactant is not particularly limited, but examples thereof include a nonionic surfactant such as polyoxyethylene alkyl ethers, polyoxyethylene alkylallyl ethers, polyoxyethylene-polyoxypropylene block copolymers, sorbitan fatty acid esters and polyoxyethylene sorbitan fatty acid esters, a fluorine-containing surfactant such as MEGAFACE F171 and F176 (manufactured by DIC Corporation), FLORAD FC430 (manufactured by Sumitomo 3M Limited), SURFYNOL E1004 (manufactured by Asahi Glass Co., Ltd.), and PF656 and PF6320 manufactured by OMNOVA Solutions, Inc., an organosiloxane polymer, and a polysiloxane polymer.

In the case in which the composition of the present invention contains a surfactant, the content thereof is preferably 0.0001% by mass to 2% by mass and more preferably 0.0005% by mass to 1% by mass with respect to the total solid content of the composition.

<Organic Carboxylic Acid>

The composition of the present invention may contain an organic carboxylic acid.

Examples of the organic carboxylic acid include an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid derivative, a phthalic acid, a terephthalic acid, an isophthalic acid, a 2-naphthoic acid, a 1-hydroxy-2-naphthoic acid, and a 2-hydroxy-3-naphthoic acid. However, when electron beam exposure is performed in vacuum, the organic carboxylic acid may vaporize from the surface of the resist film to contaminate the lithography chamber and therefore, the preferable compound is an aromatic organic carboxylic acid. Above all, for example, a benzoic acid, a 1-hydroxy-2-naphthoic acid, and a 2-hydroxy-3-naphthoic acid are suitable.

In the case in which the composition of the present invention contains an organic carboxylic acid, the content thereof is preferably 0.5% by mass to 15% by mass and more preferably 2% by mass to 10% by mass with respect to the total solid content of the composition.

<Onium Carboxylate>

The composition of the present invention may contain an onium carboxylate.

Examples of the onium carboxylate include sulfonium carboxylate, iodonium carboxylate, and ammonium carboxylate. In particular, the onium carboxylate is preferably sulfonium carboxylate or iodonium carboxylate. Furthermore, in the present invention, it is preferred that the carboxylate residue of the onium carboxylate does not contain an aromatic group and a carbon-carbon double bond. The anion moiety is particularly preferably a linear or branched, monocyclic or polycyclic alkylcarboxylate anion having 1 to 30 carbon atoms. The carboxylate anion above in which the alkyl group is partially or entirely fluorine-substituted. The alkyl chain may contain an oxygen atom. By employing such a configuration, the transparency to light at a wavelength of 220 nm or less is ensured, the sensitivity and resolving power are improved, and the density dependence and exposure margin are improved.

In the case in which the composition of the present invention contains onium carboxylate, the content thereof is preferably 1% by mass to 15% by mass and more preferably 2% by mass to 10% by mass with respect to the total solid content of the composition.

<Acid-Increasing Agent>

The composition of the present invention may further include one or two or more compounds which decompose by the action of the acid to generate an acid (hereinafter, also referred to as an acid-increasing agent).

An acid generated by the acid-increasing agent is preferably a sulfonic acid, a methide acid, or an imide acid.

In the case in which the composition of the present invention contains an acid-increasing agent, the content thereof is preferably 0.1% by mass to 50% by mass, more preferably 0.5% by mass to 30% by mass, and still more preferably 1.0% by mass to 20% by mass with respect to the total solid content of the composition.

A ratio between the amount of the acid-increasing agent and the amount of the acid generator (the solid content of the acid-increasing agent with respect to the total solid content in the composition/the solid content of the acid generator with respect to the total solid content in the composition) is not particularly limited but is preferably 0.01 to 50, more preferably 0.1 to 20, and still more preferably 0.2 to 1.0.

Examples of the acid-increasing agent that can be used in the present invention will be shown below but the acid-increasing agent is not limited thereto.

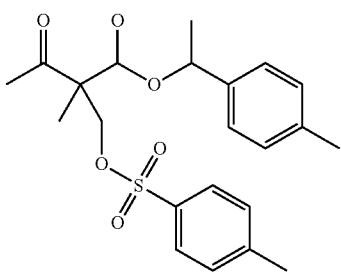

(PA-1)

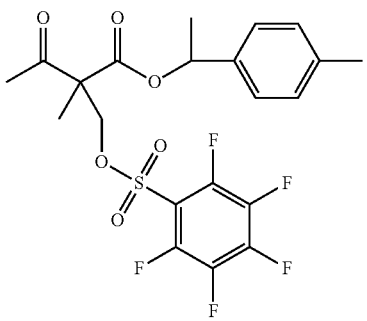

(PA-2)

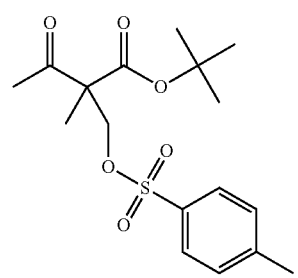

(PA-3)

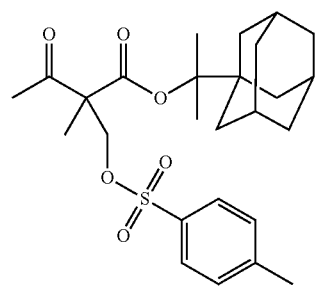

(PA-4)

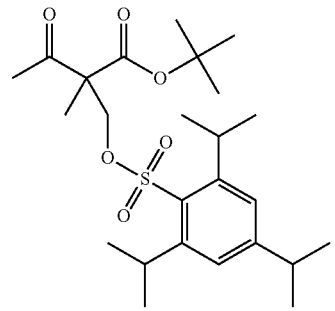

(PA-5)

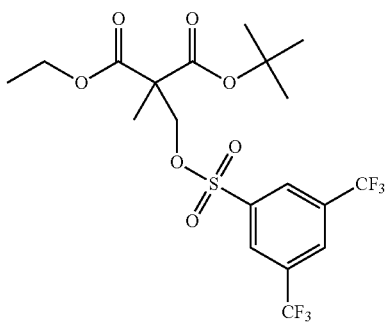

(PA-6)

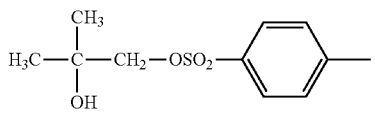

(PA-7)

-continued (PA-8)
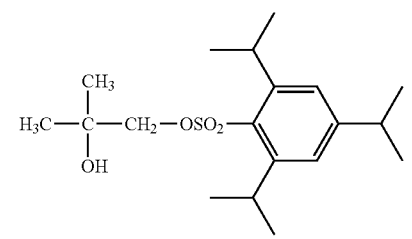

(PA-9)
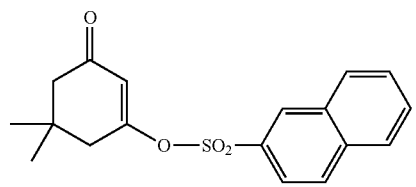

(PA-10)
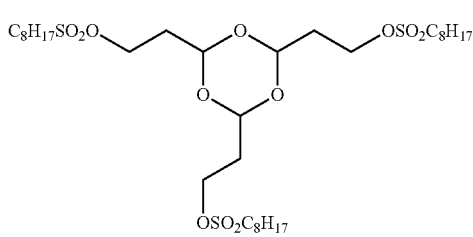

(PA-11)
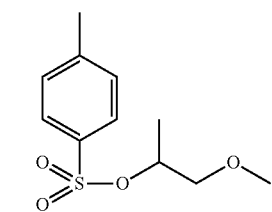

(PA-12)
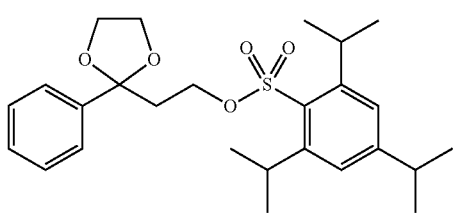

(PA-13)
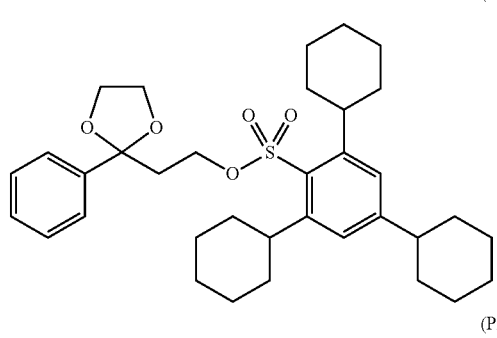

(PA-14)
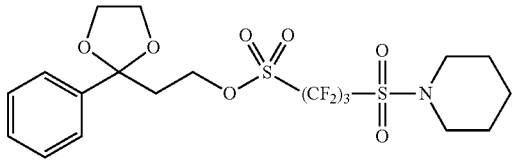

-continued (PA-15)
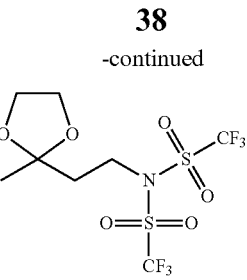

(PA-16)
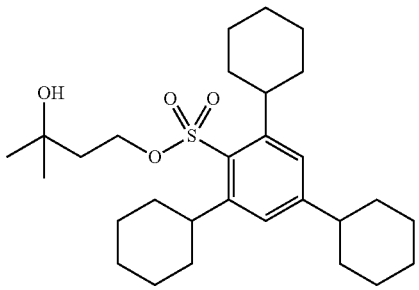

(PA-17)
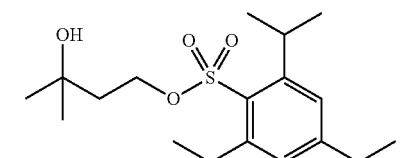

(PA-18)
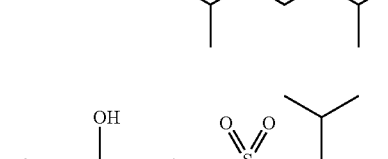

<Solvent>

The composition of the present invention may contain a solvent.

Preferable examples of the solvent include ethylene glycol monoethyl ether acetate, cyclohexanone, 2-heptanone, propylene glycol monomethyl ether (PGME, another name: 1-methoxy-2-propanol), propylene glycol monomethyl ether acetate (PGMEA, another name: 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, and ethylene carbonate. These solvents may be used alone or in combination.

The concentration of the solid content of the composition of the present invention dissolved in the above solvent is preferably 1% by mass to 40% by mass, more preferably 1% by mass to 30% by mass, and still more preferably 3% by mass to 20% by mass.

The composition of the present invention may further contain, if necessary, a dye, a plasticizer, an acid-increasing agent (described in WO95/29968A, WO98/24000A, JP1996-305262A (JP-H08-305262A), JP1997-34106A (JP-H09-34106A), JP1996-248561A (JP-H08-248561A), JP1996-503082A (JP-H08-503082A), U.S. Pat. No. 5,445, 917A, JP1996-503081A (JP-H08-503081A), U.S. Pat. No. 5,534,393A, U.S. Pat. No. 5,395,736A, U.S. Pat. No. 5,741,630A, U.S. Pat. No. 5,334,489A, U.S. Pat. No. 5,582,956A, U.S. Pat. No. 5,578,424A, U.S. Pat. No. 5,453,345A, EP665960B, EP757628B, EP665961B, U.S. Pat. No. 5,667,943A, JP1998-1508A (JP-H10-1508A), JP1998-282642A (JP-H10-282642A), JP1997-512498A (JP-H09-512498A), JP2000-62337A, JP2005-17730A, JP2008-209889A, and the like), and the like. Examples of these compounds include the respective compounds described in JP2008-268935A.

<Resist Film and Mask Blank>

The present invention also relates to a resist film that is formed using the composition of the present invention and such a resist film is formed, for example, by applying the composition of the present invention to a support such as a substrate.

The thickness of the resist film is preferably 10 nm to 150 nm and more preferably 10 nm to 120 nm.

As for the method for applying the composition to a substrate, the composition is applied to a substrate by an appropriate coating method such as spin coating, roll coating, flow coating, dip coating, spray coating, and doctor coating, but spin coating is preferred, and the rotation speed is preferably from 1,000 rpm to 3,000 rpm. The coated film is pre-baked at 60° C. to 150° C. for 1 minute to 20 minutes, preferably at 80° C. to 120° C. for 1 minute to 10 minutes, to form a thin film.

As for the materials constituting the substrate to be processed and the outermost surface layer thereof, for example, in the case of a wafer for a semiconductor, a silicon wafer can be used, and examples of the material which becomes the outermost surface include Si, $SiO_2$, SiN, SiON, TiN, WSi, BPSG, SOG, and an organic antireflection film.

In addition, the present invention also relates to a mask blank provided with the resist film obtained as above (resist-coated mask blank).

The resist-coated mask blank has a mask blank and a resist film formed on the mask blank. The photo mask blank has a substrate and is used to produce, for example, a photo mask. As the substrate for the photo mask blank, a transparent substrate such as quartz and calcium fluoride may be used. Generally, a light-shielding film, an antireflection film, further a phase shift film, and additionally a required functional film such as etching stopper film and an etching mask film, are stacked on the substrate. As for the material of the functional film, a film containing silicon or a transition metal such as chromium, molybdenum, zirconium, tantalum, tungsten, titanium, and niobium is stacked. In addition, examples of the material used for the outermost layer include a material where the main constituent material is a material containing silicon or containing silicon and oxygen and/or nitrogen, a silicon compound material where the main constituent material is the material above which further contains a transition metal, and a transition metal compound material where the main constituent material is a material containing a transition metal, particularly, one or more transition metals selected from chromium, molybdenum, zirconium, tantalum, tungsten, titanium, and niobium, or further containing one or more elements selected from oxygen, nitrogen, and carbon.

The light-shielding film may have a single layer structure but preferably has a multilayer structure in which a plurality of materials are applied one on another. In the case of a multilayer structure, the film thickness per layer is not particularly limited but is preferably from 5 nm to 100 nm and more preferably from 10 nm to 80 nm. The thickness of the entire light-shielding film is not particularly limited but is preferably from 5 nm to 200 nm and more preferably from 10 nm to 150 nm.

Out of the materials above, in the case in which pattern formation is performed using the composition on a photo mask blank provided with a material generally containing chromium and oxygen or nitrogen in the outermost surface layer thereof, a so-called undercut profile waist-shaped near the substrate is liable to be formed in general. However, in the case in which the present invention is used, the undercut problem can be improved as compared with the conventional mask blank.

Next, this resist film is irradiated with an actinic ray or radiation (such as electron beam) (hereinafter, also referred to as "exposure"), preferably baked (usually at 80° C. to 150° C., more preferably from 90° C. to 130° C.), and then developed. A solvent used in the development is preferably water. Thus, a good pattern can be obtained. This pattern is used as the mask to produce a photo mask. The resist-coated mask blank may be used to produce a semiconductor fine circuit or an imprint mold structure by appropriately performing etching, ion implantation or the like.

Incidentally, the process in the case of producing an imprint mold by using the composition of the present invention is described in, for example, JP4109085B, JP2008-162101A, and Yoshihiko Hirai (compiler), Nanoimprint no Kiso to Gijutsu Kaihatsu and Oyo Tenkai-Nanoimprint no Kiban Gijutsu to Saishin no Gijutsu Tenkai (Basic and Technology Expansion and Application Development of Nanoimprint-Substrate Technology of Nanoimprint and Latest Technology Expansion), Frontier Shuppan.

<Pattern Forming Method>

The composition of the present invention can be suitably used for a negative pattern forming process shown below. That is, the composition of the present invention can be preferably used for the process including applying the composition of the present invention on a substrate to form a resist film, irradiating (that is, exposing) the resist film with an actinic ray or radiation, and developing the exposed film with a developing solution to obtain a negative pattern. As for such a process, for example, processes described in JP2008-292975A, JP2010-217884A, and the like can be used.

The present invention also relates to a pattern forming method including exposing the resist film or the resist-coated mask blank provided with the film, and developing the exposed resist film or the resist-coated mask blank provided with the exposed film. In the present invention, the exposure is preferably performed using an electron beam or extreme-ultraviolet rays. In addition, the present invention also relates to a photo mask obtained by exposing and developing the resist-coated mask blank.

In the production of a precision integrated circuit device or the like, first, the exposure of the resist film (pattern forming step) is preferably performed by patternwise irradiating the resist film of the present invention with an electron beam or extreme-ultraviolet rays (EUV). The exposure is performed with an exposure dose of, in the case of an electron beam, about 0.1 $\mu C/cm^2$ to 20 $\mu C/cm^2$, preferably about 3 $\mu C/cm^2$ to 10 $\mu C/cm^2$, and in the case of extreme-ultraviolet rays, about 0.1 $mJ/cm^2$ to 20 $mJ/cm^2$, preferably about 3 $mJ/cm^2$ to 15 $mJ/cm^2$.

Next, heating after development (post-exposure baking) is performed on a hot plate at 60° C. to 150° C. for 1 minute to 20 minutes, preferably at 80° C. to 120° C. for 1 minute to 10 minutes, and subsequently, the resist film is developed, rinsed and dried, whereby a resist pattern is formed. Subsequently, the development is performed using a developing solution for 0.1 minutes to 3 minutes, preferably 0.5 minutes to 2 minutes by a typical method such as a dipping method, a puddle method, or a spraying method.

As the developing solution, either of an organic developing solution and an alkali developing solution can be used.

As the organic developing solution, a polar solvent such as an ester-based solvent (such as butyl acetate or ethyl acetate), a ketone-based solvent (such as 2-heptanone or cyclohexanone), an alcohol-based solvent, an amide-based solvent and an ether-based solvent, and a hydrocarbon-based solvent can be used. It is preferable that the moisture content in the entire organic developing solution is less than 10% by mass and more preferable that the organic developing solution substantially contains no water.

As the alkali developing solution, a quaternary ammonium salt typified by tetramethylammonium hydroxide is usually used and in addition to the quaternary ammonium salt, an aqueous alkali solution such as an inorganic alkali, a primary amine, a secondary amine, a tertiary amine, an alcoholamine, a cyclic amine or the like can also be used. Furthermore, the alkali developing solution can be used by adding alcohols and a surfactant in an appropriate amount. The alkali concentration of the alkali developing solution is usually 0.1% by mass to 20% by mass. The pH of the alkali developing solution is usually 10.0 to 15.0.

Furthermore, alkali developing solution can be used by adding alcohols and a surfactant to the aqueous alkali solution in an appropriate amount.

Since the composition of the present invention is a negative resist composition used for forming a negative pattern, the film in the unexposed area is dissolved and the exposed area is less likely to be dissolved in the developing solution by the crosslinking of the compound. Thus, a target pattern can be formed on the substrate using the above-described properties.

In addition, the present invention also relates to an electronic device manufacturing method including the above-described pattern forming method of the present invention and an electronic device manufactured by the method.

The electronic device of the preset invention is suitably mounted on electric and electronic apparatus (such as domestic electric apparatus, OA and peripheral devices of broadcasting media, optical apparatus, and communication devices).

EXAMPLES

The present invention will be further specifically described with reference to examples but the contents of the present invention are not limited to these examples.

(I) Examples as Chemical Amplification Negative Resist (Electron Beam, Alkali Development) (Synthesis Example of Polymer Compound (A))

Synthesis Example 1: Synthesis of Polymer Compound (A1)

20 g of poly(p-hydroxystyrene) (VP2500), manufactured by Nippon Soda Co., Ltd. was dissolved in 120 mL of tetrahydrofuran (THF), and 4.96 g of 1-adamantanecarbonyl chloride and 3.37 g of triethylamine were added thereto. The mixture was stirred at 50° C. for 4 hours. The reaction solution was returned to room temperature and then 100 mL of ethyl acetate and 100 mL of distilled water were added thereto. An aqueous 1 N HCl solution was added little by little to the reaction solution to effect neutralization while stirring the reaction solution in ice water. The reaction solution was transferred to a separating funnel, and 100 mL of ethyl acetate and 100 mL of distilled water were further added. After stirring, the aqueous layer was removed, and the organic layer was washed with 200 mL of distilled water five times. Then, the organic layer was concentrated and added dropwise in 2 L of hexane. After filtration, the powder was collected from the solution and vacuum-dried to obtain 20.6 g of Polymer Compound (A1).

Other polymer compounds were synthesized in the same manner as Polymer Compound (A1).

With respect to the polymer compounds obtained, the compositional ratio (molar ratio) of the polymer compound was calculated by $^1$H-NMR measurement. In addition, the weight-average molecular weight (Mw, in terms of polystyrene), number average molecular weight (Mn, in terms of polystyrene) and dispersity (Mw/Mn) of the polymer compound were calculated by GPC (solvent: THF, column: TSK gel Multipore HXL-M, manufactured by Tosoh Corporation, column temperature: 40° C., flow velocity: 1.0 mL/min, detector: RI) measurement.

The glass transition temperature (Tg) was measured by using a differential scanning calorimeter (DSC), Q2000, manufactured by TA Instruments. Specifically, Tg was obtained from an inflection point when about 2 mg of a vacuum-dried polymer sample was weighed on an aluminum pan, the aluminum pan was set on the DSC measurement holder, and the temperature was raised from 10° C. to 200° C. at 2° C./min. In the case in which the inflection point of the DTA curve corresponding to the glass transition temperature up to 200° C. was not observed, it was determined that Tg was 200° C. or higher.

In Tables below, the weight-average molecular weight, the dispersity and Tg will be shown together with the chemical formula and the compositional ratio of the polymer compound.

TABLE 1

| | | (Part 1) | | | | |
|---|---|---|---|---|---|---|
| Polymer Compound | Chemical Formula | | Compositional Ratio (Molar Ratio) | Weight-average molecular weight | Dispersity | Tg (° C.) |
| Polymer Compound (A1) | 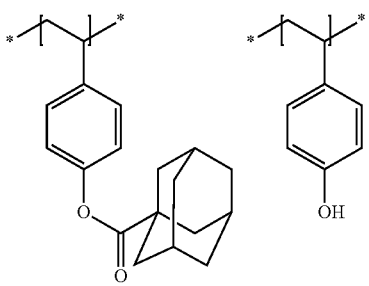 | | 15/85 | 3,600 | 1.13 | 164 |

TABLE 1-continued

| Polymer Compound | Structure | Ratio | Mw | PDI | Value |
|---|---|---|---|---|---|
| Polymer Compound (A2) | poly(4-hydroxystyrene) | 100 | 3,200 | 1.13 | 154 |
| Polymer Compound (A3) | 4-(naphthalene-1-carbonyloxy)styrene / 4-hydroxystyrene | 15/85 | 3,400 | 1.13 | 151 |
| Polymer Compound (A4) | 4-(tosyloxy)styrene / 4-hydroxystyrene | 10/90 | 3,500 | 1.13 | 144 |
| Polymer Compound (A5) | 4-(cyclohexanecarbonyloxy)styrene / 4-hydroxystyrene | 10/90 | 5,000 | 1.1 | 150 |
| Polymer Compound (A6) | 4-(cyclohexanecarbonyloxy)styrene / 4-hydroxystyrene | 15/85 | 6,400 | 1.07 | 155 |
| Polymer Compound (A7) | 4-hydroxystyrene / 1-vinylnaphthalene | 85/15 | 4,600 | 1.5 | 153 |

TABLE 1-continued

| Polymer Compound (A8) | [structure: copolymer of p-hydroxystyrene, p-chlorostyrene, and indene-based unit] | 76/19/5 | 4,500 | 1.5 | 159 |

(Part 2)

| Comparative Polymer Compound/Comparative Compound | Chemical Formula | Compositional Ratio (Molar Ratio) | Weight average molecular weight | Dispersity | Tg (° C.) |
| --- | --- | --- | --- | --- | --- |
| Comparative Polymer Compound (a1) | [structure: poly(m-hydroxystyrene)] | 100 | 3,200 | 1.13 | 127 |
| Comparative Polymer Compound (a2) | [structure: copolymer of p-hydroxystyrene and p-benzyloxystyrene] | 90/10 | 7,000 | 1.13 | 160 |
| Comparative Polymer Compound (a3) | [structure: copolymer of p-hydroxystyrene and p-benzyloxystyrene] | 80/20 | 3,500 | 1.13 | 130 |
| Comparative Polymer Compound (a4) | [structure: calix[4]arene with HO, OCH₃ and 2,4-dimethylphenyl substituents] | — | 961.2 (weight-average molecular weight) | 1 | 200° C. or Higher |

(Synthesis of Crosslinking Agent (C))

Crosslinking Agent: Synthesis Example 1

To a solution of 20 mL of a 10 wt % aqueous potassium hydroxide solution and 20 mL of ethanol, 5.8 g (10 mmol) of a phenolic compound (X1) represented by the formula below was added and dissolved under stirring at room temperature. To the solution, 14.0 mL (160 mmoL) of a 37% aqueous formalin solution was slowly added at room temperature. Furthermore, the solution was stirred at 40° C. for 24 hours under a nitrogen atmosphere and then was put into 200 mL of water in a beaker. While cooling the resultant solution in an ice water bath, a 2.0 wt % aqueous acetic acid solution was slowly added thereto until the pH became 5.0. The precipitated product was separated from the solution by filtration, sufficiently washed with water, and then dried. Purification was performed by high speed liquid chromatography and thus 4.8 g of Phenolic Compound 1 (C1) represented by the formula below was obtained.

The structure of Phenolic Compound 1 (C1) obtained was confirmed by a $^1$H-NMR spectrum. $^1$H-NMR: 1.17 to 1.72 (40H), 2.66 (4H), 4.40 to 4.51 (8H), 4.54 (2H), 5.38 (4H), 6.78 to 7.06 (8H), and 8.67 (4H).

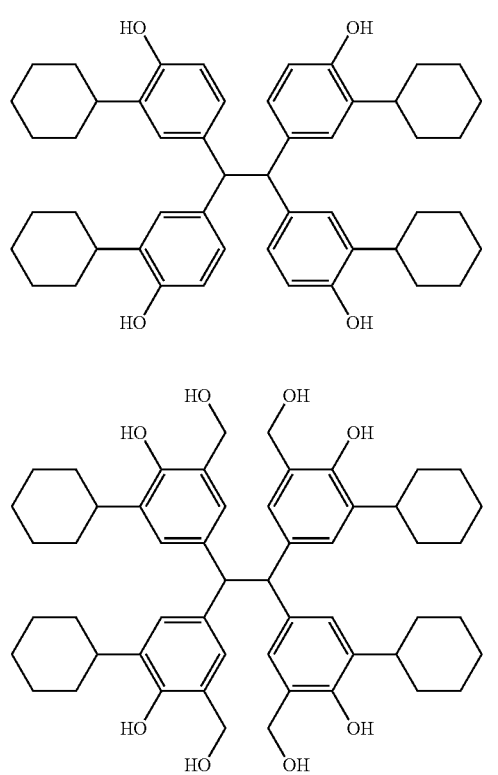

Crosslinking Agent: Synthesis Example 2

5.7 g (1.0 mmol) of Phenolic Compound (X3) represented by the formula below was added to 250 mL of methanol and dissolved under heating and stirring. To the solution, 0.25 mL of concentrated sulfuric acid was added and the mixture was refluxed under heating for 15 hours. After the reaction is finished, the reaction solution was cooled and 1.0 g of potassium carbonate was added thereto. The solution was concentrated and then 300 mL of ethyl acetate was added thereto. The solution was washed with water three times and then concentrated. Thus, 4.9 g of a white compound of Phenolic Compound (C3) represented by the formula below was obtained.

The structure of Phenolic Compound (C3) obtained was confirmed by a $^1$H-NMR spectrum. $^1$H-NMR: 1.98 (12H), 3.2 (12H), 4.29 (8H), 6.87 to 7.00 (8H), and 8.05 (4H)

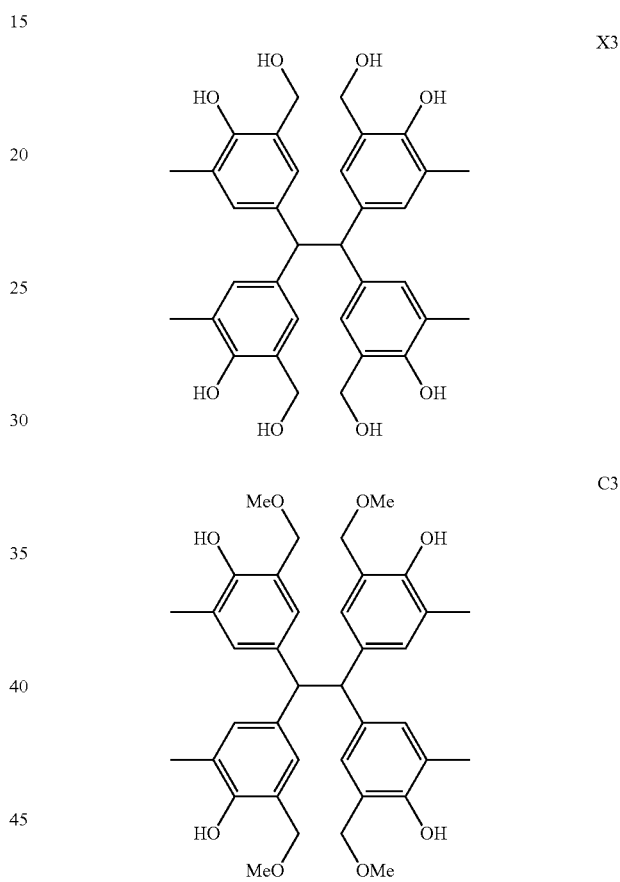

Incidentally, other crosslinking agents were synthesized with reference to the synthetic procedures of Crosslinking Agents (C1) and (C3) above. In Table below, the chemical formula and the glass transition temperature of the crosslinking agent will be shown together.

The glass transition temperature (Tg) of the crosslinking agent was measured using a differential scanning calorimeter (DSC), Q2000, manufactured by TA Instruments. Specifically, Tg was obtained from an inflection point when a vacuum-dried polymer sample (about 2 mg) was weighed on an aluminum pan, the aluminum pan was set on the DSC measurement holder, and the temperature was raised from 10° C. to 200° C. at 2° C./min. In the case in which the inflection point of the DTA curve corresponding to the glass transition temperature up to 200° C. was not observed, it was determined that Tg was 200° C. or higher.

TABLE 2

| (Part 1) | | |
|---|---|---|
| Crosslinking Agent | Chemical Formula | Tg (° C.) |
| Crosslinking Agent (C1) | [chemical structure] | 200° C. or Higher |
| Crosslinking Agent (C2) | [chemical structure] | 200° C. or Higher |
| Crosslinking Agent (C3) | [chemical structure] | 200° C. or Higher |
| Crosslinking Agent (C4) | [chemical structure] | 200° C. or Higher |

TABLE 2-continued
| | | |
|---|---|---|
| Crosslinking Agent (C5) | 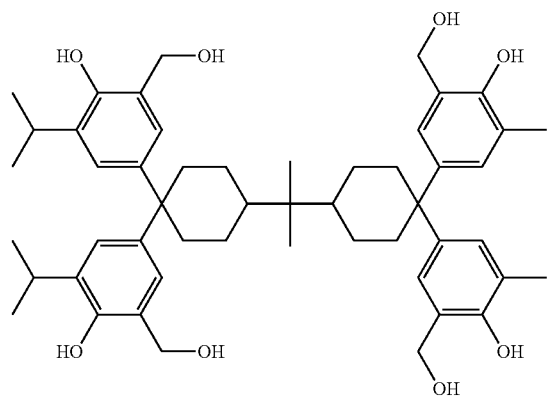 [SMILES: Cc1cc(C2(c3cc(C)c(O)c(CO)c3)CCC(C(C)(C)C3CCC(c4cc(CO)c(O)c(C(C)C)c4)(c4cc(CO)c(O)c(C(C)C)c4)CC3)CC2)cc(CO)c1O] | 200° C. or Higher |
| Crosslinking Agent (C6) | 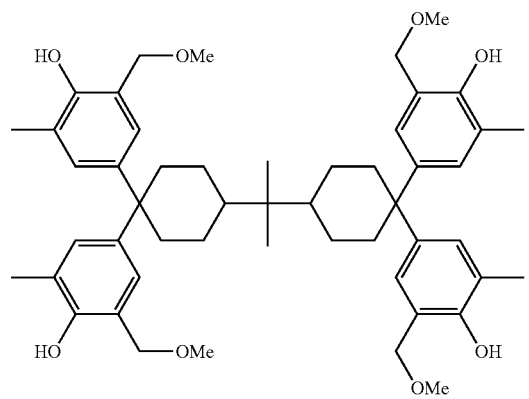 | 200° C. or Higher |
| Crosslinking Agent (C7) | 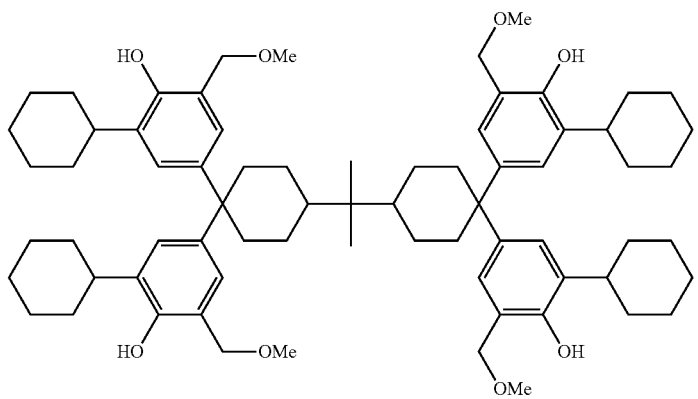 [SMILES: COCc1cc(C2(c3cc(COC)c(O)c(C4CCCCC4)c3)CCC(C(C)(C)C3CCC(c4cc(COC)c(O)c(C5CCCCC5)c4)(c4cc(COC)c(O)c(C5CCCCC5)c4)CC3)CC2)cc(C2CCCCC2)c1O] | 200° C. or Higher |
(Part 2)
| | | |
|---|---|---|
| Comparative Crosslinking Agent (c1) | 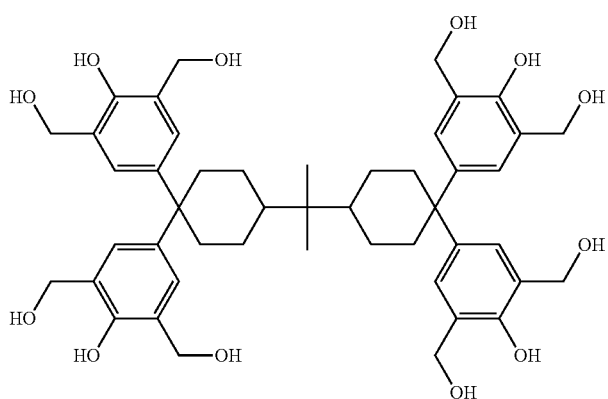 [SMILES: CC(C)(C1CCC(c2cc(CO)c(O)c(CO)c2)(c2cc(CO)c(O)c(CO)c2)CC1)C1CCC(c2cc(CO)c(O)c(CO)c2)(c2cc(CO)c(O)c(CO)c2)CC1] | 67 |

TABLE 2-continued

| | | |
|---|---|---|
| Comparative Crosslinking Agent (c2) | 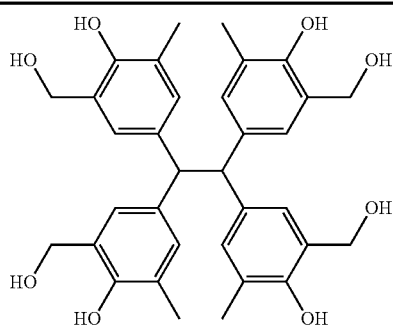 | 165 |
| Comparative Crosslinking Agent (c3) | 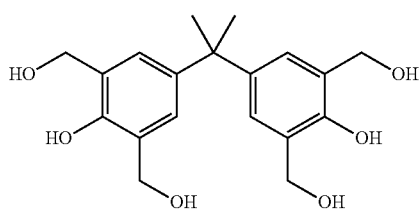 [SMILES: CC(C)(c1cc(CO)c(O)c(CO)c1)c1cc(CO)c(O)c(CO)c1] | 27 |
| Comparative Crosslinking Agent (c4) | 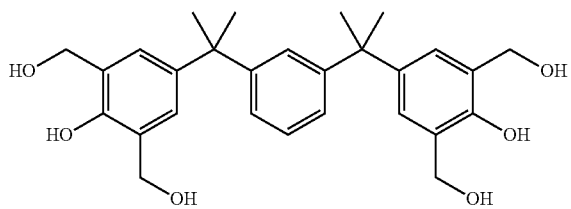 [SMILES: CC(C)(c1cccc(C(C)(C)c2cc(CO)c(O)c(CO)c2)c1)c1cc(CO)c(O)c(CO)c1] | 135 |
| Comparative Crosslinking Agent (c5) | 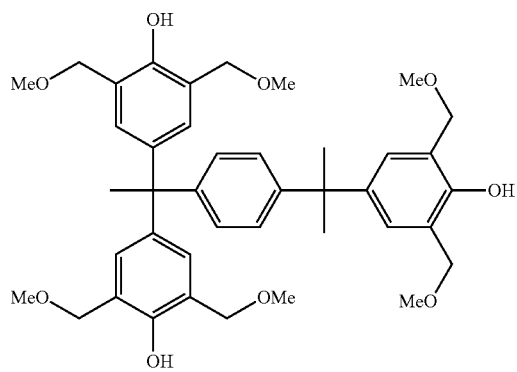 [SMILES: COCc1cc(C(C)(C)c2ccc(C(C)(c3cc(COC)c(O)c(COC)c3)c3cc(COC)c(O)c(COC)c3)cc2)cc(COC)c1O] | 180° C. or Lower |
| Comparative Crosslinking Agent (c6) | 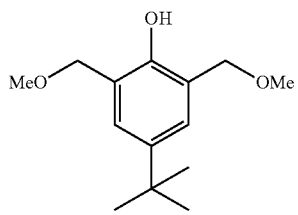 [SMILES: COCc1cc(C(C)(C)C)cc(COC)c1O] | 100° C. or Lower |

Example 1E (1) Preparation of Support

A Cr oxide-deposited 6-inch wafer (a wafer subjected to a treatment of forming a shielding film, which is used for normal photo mask blank) was prepared.

(2) Preparation of Composition
(Composition of Composition N1)
Polymer Compound (A1) 0.60 g
Photoacid generator (the structural formula is shown below) 0.12 g
Crosslinking Agent (C1) 0.12 g
Tetrabutylammonium hydroxide (basic compound) 0.002 g
2-Hydroxy-3-naphthoic acid (organic carboxylic acid) 0.012 g
Surfactant PF6320 (manufactured by OMNOVA Solutions, Inc.) 0.001 g
Propylene glycol monomethyl ether acetate (solvent) 4.0 g
Propylene glycol monomethyl ether (solvent) 5.0 g (z42)

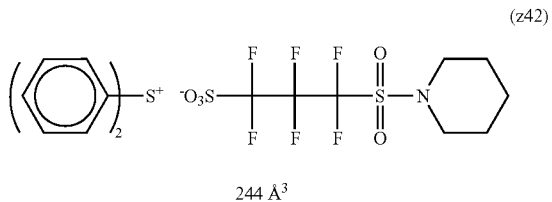

244 Å³

The composition formed by mixing the above components was finely filtered through a membrane filter having a pore size of 0.04 μm and thus a resist coating solution (Composition N1) was obtained.

(3) Preparation of Resist Film

Composition N1 was applied to the 6-inch wafer by using a spin coater, Mark 8, manufactured by Tokyo Electron Ltd. and dried on a hot plate at 110° C. for 90 seconds to obtain a resist film having a thickness of 100 nm. That is, a resist-coated mask blank was obtained.

(4) Production of Negative Resist Pattern

This resist film was patternwise irradiated by using an electron beam lithography device (ELS-7500, manufactured by ELIONIX INC., accelerating voltage: 50 KeV). After the irradiation, the resist film was heated on a hot plate at 120° C. for 90 seconds, dipped in an aqueous 2.38% by mass tetramethylammonium hydroxide (TMAH) solution for 60 seconds, rinsed with water for 30 seconds and dried. Thus, a pattern was obtained.

(5) Evaluation of Resist Pattern

The obtained pattern was evaluated for the sensitivity, resolving power, pattern profile, line edge roughness (LER) and dry etching resistance by the following methods.

[Sensitivity]

The cross-sectional profile of the pattern obtained was observed using a scanning electron microscope (S-4300, manufactured by Hitachi, Ltd.), and the exposure dose (electron beam irradiation dose) when resolving a resist pattern having a line width of 100 nm (line:space=1:1) was taken as the sensitivity. A smaller value indicates higher sensitivity.

[Resolving Power]

The limiting resolving power (the minimum line width below which the line and the space (line:space=1:1) were separated and resolved) at the exposure dose (electron beam irradiation dose) showing the sensitivity above was taken as the resolving power (nm).

[Pattern Profile]

The cross-sectional profile of the line pattern having a line width of 100 nm (L/S=1/1) at the exposure dose (electron beam irradiation dose) showing the sensitivity above was observed by a scanning electron microscope (S-4300, manufactured by Hitachi, Ltd.). The cross-sectional profile of the line pattern was rated "reverse taper" when the ratio represented by [line width in the top part (surface part) of line pattern/line width in the middle of line pattern (the position of half the height of line pattern)] is 1.5 or more, rated "slightly reverse taper" when the ratio above is 1.2 or more and less than 1.5, and rated "rectangle" when the ratio is less than 1.2. It is desirable that the cross-sectional profile is not rated "reverse taper".

[Line Edge Roughness (LER)]

A line pattern (L/S=1/1) having a line width of 100 nm was formed with the irradiation dose (electron beam irradiation dose) showing the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of the measured distances was determined, and 3σ was calculated. A smaller value indicates better performance.

[Dry Etching Resistance]

A resist film where a resist pattern having a line width of 100 nm (line:space=1:1) was formed with the irradiation dose (electron beam irradiation dose) showing the sensitivity above was subjected to dry etching for 60 seconds by using an $Ar/C_4F_6/O_2$ gas (a mixed gas in a volume ratio of 100/4/2) in HITACHI U-621. Then, the residual resist film ratio was measured and used as an indicator of dry etching resistance.

Very good: A residual film ratio of 95% or more
Good: 90% or more and less than 95%
Bad: Less than 90%

[Example 2E] to [Example 16E], [Comparative Example 1E] to [Comparative Example 6E]

Patterns were formed in the same procedure as in Example 1E except that compositions in which the polymer compound, the acid generator, the basic compound, the crosslinking agent, and the solvent in Composition N1 used were changed as shown in Table 3 below and various evaluations were performed.

TABLE 3

(Part 1)

| Composition | Polymer Compound | Acid Generator | Crosslinking Agent | Basic Compound | Solvent |
|---|---|---|---|---|---|
| N1 | A1 (0.6 g) | z42 (0.12 g) | C1 (0.12 g) | B1 (0.002 g) | S2/S1 (5.0 g/4.0 g) |
| N2 | A2 (0.6 g) | z49 (0.12 g) | C1 (0.12 g) | B1 (0.002 g) | S1/S3 (5.0 g/4.0 g) |
| N3 | A3 (0.6 g) | z63 (0.12 g) | C1 (0.12 g) | B1 (0.002 g) | S2/S3 (5.0 g/4.0 g) |

TABLE 3-continued

| | | | | | |
|---|---|---|---|---|---|
| N4 | A4 (0.6 g) | z68 (0.12 g) | C1 (0.12 g) | B1 (0.002 g) | S2/S7 (5.0 g/4.0 g) |
| N5 | A5 (0.6 g) | z65 (0.12 g) | C1 (0.12 g) | B1 (0.002 g) | S2/S1 (5.0 g/4.0 g) |
| N6 | A6 (0.6 g) | z67 (0.12 g) | C1 (0.12 g) | B1 (0.002 g) | S2/S1 (5.0 g/4.0 g) |
| N7 | A7 (0.6 g) | z37 (0.12 g) | C1 (0.12 g) | B1 (0.002 g) | S1/S2/S6 (4.0 g/4.0 g/1.0 g) |
| N8 | A8 (0.6 g) | z45 (0.12 g) | C1 (0.12 g) | B1 (0.002 g) | S1/S2/S5 (4.0 g/4.0 g/1.0 g) |
| N9 | A4 (0.6 g) | z48/z66 (0.06 g/0.06 g) | C2 (0.12 g) | B4 (0.002 g) | S1/S2/S4 (4.0 g/4.0 g/1.0 g) |
| N10 | A1 (0.6 g) | z49 (0.12 g) | C3 (0.12 g) | B4 (0.002 g) | S2/S1 (5.0 g/4.0 g) |
| N11 | A1 (0.6 g) | z61 (0.12 g) | C4 (0.12 g) | B1/B6 (0.001 g/0.001 g) | S2/S1 (5.0 g/4.0 g) |
| N12 | A1 (0.6 g) | z2 (0.12 g) | C5 (0.12 g) | B4 (0.002 g) | S2/S1 (5.0 g/4.0 g) |
| N13 | A1 (0.6 g) | z5 (0.12 g) | C6 (0.12 g) | B5 (0.002 g) | S2/S1 (5.0 g/4.0 g) |
| N14 | A1 (0.6 g) | z63 (0.12 g) | C7 (0.12 g) | B4 (0.002 g) | S2/S1 (5.0 g/4.0 g) |
| N15 | A2 (0.6 g) | z65 (0.12 g) | C1/C6 (0.08 g/0.04 g) | B1 (0.002 g) | S2/S1 (5.0 g/4.0 g) |
| N16 | A1/A2 (0.3 g/0.3 g) | z8 (0.12 g) | C6 (0.12 g) | B4 (0.002 g) | S2/S1 (5.0 g/4.0 g) |

(Part 2)

| Composition | Resin/Compound | Acid Generator | Basic Compound | Crosslinking Agent | Solvent |
|---|---|---|---|---|---|
| Comparative Composition N1 | Comparative Resin (a1) (0.6 g) | z2 (0.12 g) | B2 (0.002 g) | Comparative Crosslinking Agent c1 (0.12 g) | S2/S1 (5.0 g/4.0 g) |
| Comparative Composition N2 | Comparative Resin (a2) (0.6 g) | z2 (0.12 g) | B2 (0.002 g) | Comparative Crosslinking Agent c2 (0.12 g) | S2/S1 (5.0 g/4.0 g) |
| Comparative Composition N3 | Comparative Resin (a3) (0.6 g) | z2 (0.12 g) | B2 (0.002 g) | Comparative Crosslinking Agent c3 (0.12 g) | S2/S1 (5.0 g/4.0 g) |
| Comparative Composition N4 | Comparative Compound (a4) (0.6 g) | z2 (0.12 g) | B2 (0.002 g) | Comparative Crosslinking Agent c4 (0.12 g) | S2/S1 (5.0 g/4.0 g) |
| Comparative Composition N5 | Resin (A2) (0.6 g) | z2 (0.12 g) | B2 (0.002 g) | Comparative Crosslinking Agent c1 (0.12 g) | S2/S1 (5.0 g/4.0 g) |
| Comparative Composition N6 | Comparative Resin (a1) (0.6 g) | z2 (0.12 g) | B2 (0.002 g) | Crosslinking Agent C1 (0.12 g) | S2/S1 (5.0 g/4.0 g) |
| Comparative Composition N7 | Comparative Resin (a1) (0.6 g) | z2 (0.12 g) | B2 (0.002 g) | Comparative Crosslinking Agent c5 (0.12 g) | S2/S1 (5.0 g/4.0 g) |
| Comparative Composition N8 | Comparative Resin (a1) (0.6 g) | z2 (0.12 g) | B2 (0.002 g) | Comparative Crosslinking Agent c6 (0.12 g) | S2/S1 (5.0 g/4.0 g) |

Abbreviations of materials other than the above-mentioned materials used in Examples and Comparative Examples above and below will be described below.

[Acid Generator (Compound (B))]

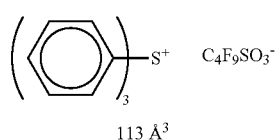

(z2)

113 Å³

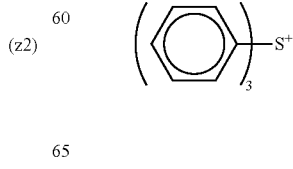

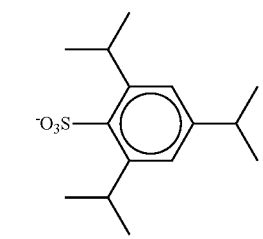

(z5)

303 Å³

-continued
(z8)
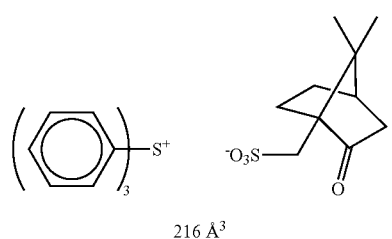
216 Å³
(z37)
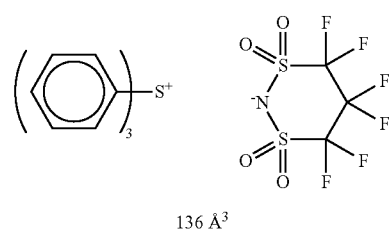
136 Å³
(z42)
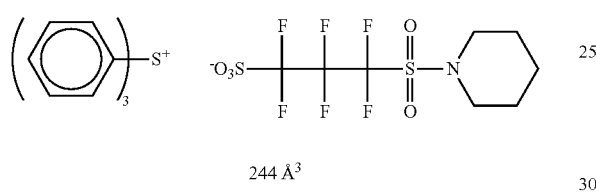
244 Å³
(z45)
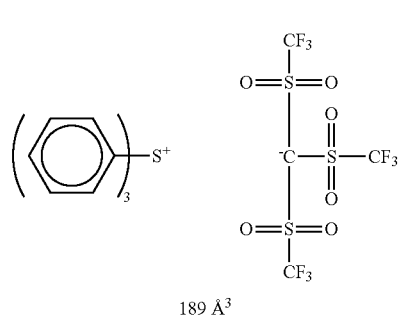
189 Å³
(z48)
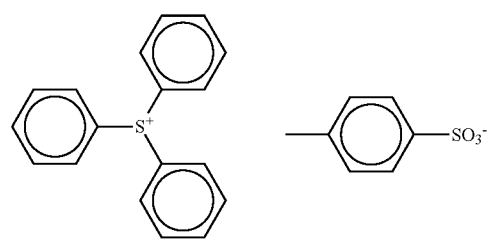
186 Å³
(z49)
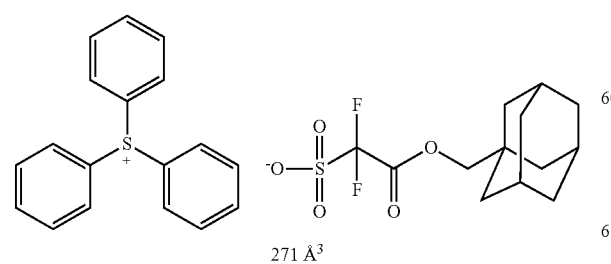
271 Å³
-continued
(z61)
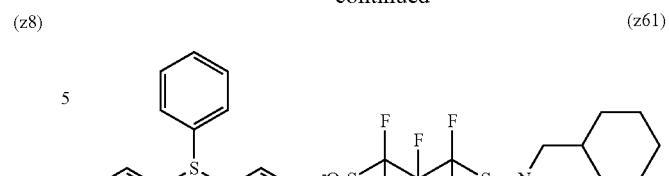
311 Å³
(z63)
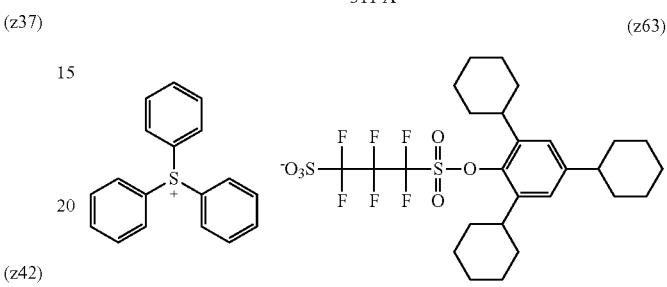
535 Å³
(z65)
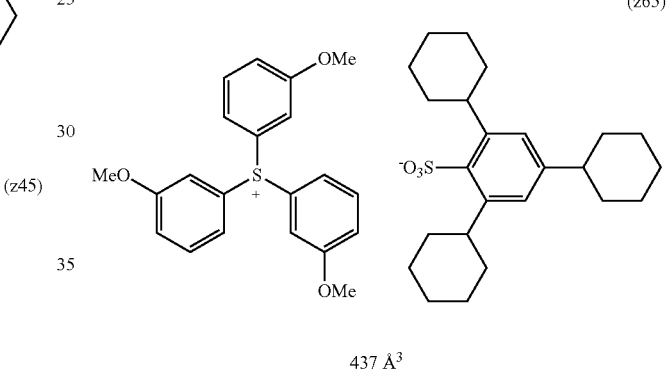
437 Å³
(z66)
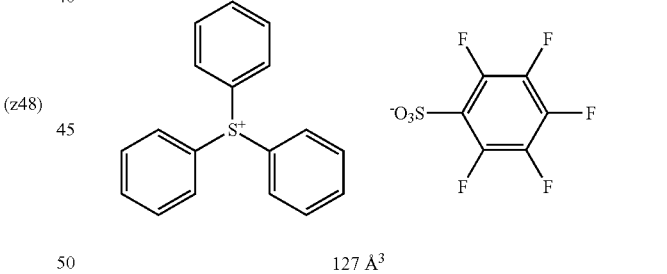
127 Å³
(z67)
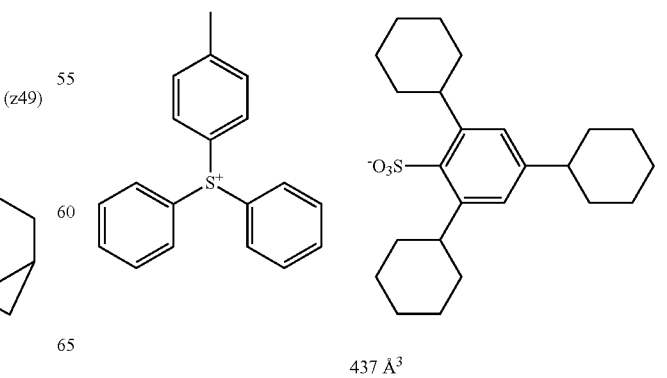
437 Å³

-continued (z68)

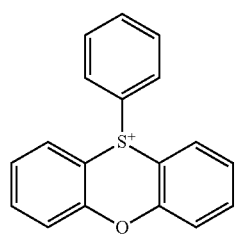

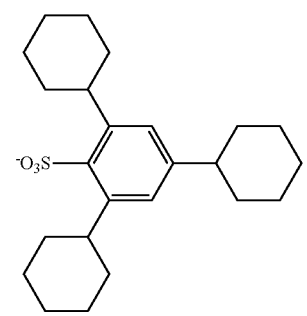

437 Å³

[Basic Compound]
B1: Tetrabutylammonium hydroxide
B2: Tri(n-octyl)amine

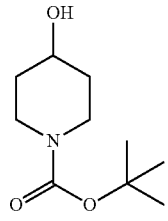

B4

-continued

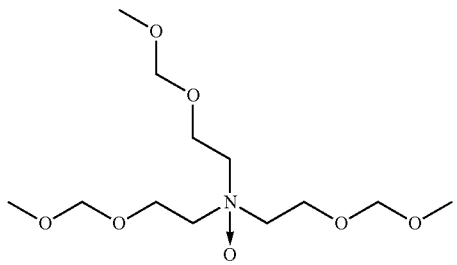

B5

B6

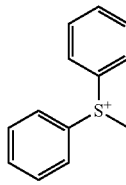

[Solvent]
S1: Propylene glycol monomethyl ether acetate (1-methoxy-2-acetoxypropane)
S2: Propylene glycol monomethyl ether (1-methoxy-2-propanol)
S3: 2-Heptanone
S4: Ethyl lactate
S5: Cyclohexanone
S6: γ-Butyrolactone
S7: Propylene carbonate The evaluation results are shown in Table 4.

TABLE 4

| Example | Composition | Sensitivity ($\mu C/cm^2$) | Resolving Power (nm) | Pattern Profile | LER (nm) | Dry etching resistance |
|---|---|---|---|---|---|---|
| 1E | N1 | 10.2 | 25 | Rectangle | 4.2 | Very good |
| 2E | N2 | 10 | 30 | Slightly reverse taper | 4.2 | Good |
| 3E | N3 | 10.2 | 25 | Rectangle | 4.2 | Very good |
| 4E | N4 | 10.2 | 25 | Rectangle | 4.2 | Very good |
| 5E | N5 | 10.2 | 25 | Rectangle | 4.2 | Very good |
| 6E | N6 | 10.2 | 25 | Rectangle | 4.2 | Very good |
| 7E | N7 | 13.3 | 25 | Rectangle | 4.8 | Very good |
| 8E | N8 | 13.2 | 25 | Rectangle | 4.8 | Very good |
| 9E | N9 | 10.3 | 25 | Rectangle | 4.8 | Very good |
| 10E | N10 | 10.3 | 30 | Slightly reverse taper | 5 | Good |
| 11E | N11 | 10.3 | 25 | Rectangle | 4.2 | Very good |
| 12E | N12 | 10.2 | 25 | Rectangle | 4.2 | Very good |
| 13E | N13 | 10.1 | 25 | Rectangle | 4.2 | Very good |
| 14E | N14 | 10.2 | 25 | Rectangle | 4.2 | Very good |
| 15E | N15 | 10.3 | 30 | Slightly reverse taper | 4.2 | Good |
| 16E | N16 | 10.2 | 25 | Rectangle | 5 | Very good |
| Comparative Example 1E | Comparative Composition N1 | 11.8 | 45 | Reverse taper | 5.5 | Bad |
| Comparative Example 2E | Comparative Composition N2 | 10.6 | 45 | Slightly reverse taper | 5.5 | Good |
| Comparative Example 3E | Comparative Composition N3 | 10.5 | 45 | Reverse taper | 5.5 | Bad |
| Comparative Example 4E | Comparative Composition N4 | 11.6 | 45 | Reverse taper | 5.5 | Bad |
| Comparative Example 5E | Comparative Composition N5 | 10.7 | 40 | Slightly reverse taper | 5.5 | Good |
| Comparative Example 6E | Comparative Composition N6 | 10.8 | 40 | Slightly reverse taper | 5.5 | Good |
| Comparative Example 7E | Comparative Composition N7 | 10.8 | 45 | Reverse taper | 5 | Bad |

TABLE 4-continued

| Example | Composition | Sensitivity (μC/cm²) | Resolving Power (nm) | Pattern Profile | LER (nm) | Dry etching resistance |
|---|---|---|---|---|---|---|
| Comparative Example 8E | Comparative Composition N8 | 10.8 | 40 | Slightly reverse taper | 5 | Bad |

It is seen from the results shown in Table 4 that the composition according to the present invention has excellent sensitivity, resolving power, pattern profile, line edge roughness (LER), and dry etching resistance. Particularly, it is confirmed from the comparison of Example 10E with other Examples that the use of a crosslinking agent including a cyclic aliphatic hydrocarbon group enables to obtain more excellent effect.

(II) Example as Chemical Amplification Negative Resist (EUV, Alkali Development)

Examples 1F to 6F and Comparative Examples 1F and 2F (Preparation of Resist Solution)

The composition shown in Table 3 was filtered through a polytetrafluoroethylene filter having a pore size of 0.04 μm and thus a negative resist solution was prepared.

(Evaluation of Resist)

The negative resist solution prepared was uniformly applied to a hexamethyldisilazane-treated silicon substrate by using a spin coater and dried by heating on a hot plate at 100° C. for 60 seconds. Thus, a resist film having a thickness of 0.05 μm was formed.

The obtained resist film was evaluated for the sensitivity, resolving power, pattern profile, line edge roughness (LER) and dry etching resistance by the following methods.

[Sensitivity]

The obtained resist film was exposed to EUV light (wavelength: 13 nm) through a reflective type mask having a 1:1 line-and-space pattern having a line width of 100 nm by changing the exposure dose in steps of 0.1 mJ/cm² in the range of 0 mJ/cm² to 20.0 mJ/cm², then baked at 110° C. for 90 seconds. Then, the film was developed with an aqueous 2.38% by mass tetramethylammonium hydroxide (TMAH) solution.

The exposure dose when reproducing a line-and-space (L/S=1/1) mask pattern having a line width of 100 nm was taken as the sensitivity. A smaller value indicates higher sensitivity.

[Resolving Power (LS)]

The limiting resolving power (the minimum line width below which the line and the space (line:space=1:1) were separated and resolved) at the exposure dose showing the sensitivity above was taken as the LS resolving power (nm).

[Pattern Profile]

The cross-sectional profile of the line pattern (L/S=1/1) having a line width of 100 nm at the exposure dose showing the sensitivity above was observed by a scanning electron microscope (S-4300, manufactured by Hitachi, Ltd.). The cross-sectional profile of the line pattern was rated "reverse taper" when the ratio represented by [line width in the top part (surface part) of line pattern/line width in the middle of line pattern (the position of half the height of line pattern)] is 1.5 or more, rated "slightly reverse taper" when the ratio above is 1.2 or more and less than 1.5, and rated "rectangle" when the ratio is less than 1.2.

[Line Edge Roughness (LER)]

A line pattern (L/S=1/1) having a line width of 100 nm was formed with the exposure dose showing the sensitivity above. At arbitrary 30 points included in the longitudinal 50 μm region of the pattern, the distance from the reference line where the edge should be present was measured using a scanning electron microscope (S-9220, manufactured by Hitachi, Ltd.). The standard deviation of the measured distances was determined, and 3σ was calculated. A smaller value indicates better performance.

[Dry Etching Resistance]

A resist film formed by performing entire surface irradiation with the exposure dose showing the sensitivity above was subjected to dry etching for 60 seconds by using an Ar/C$_4$F$_6$/O$_2$ gas (a mixed gas in a volume ratio of 100/4/2) in HITACHI U-621. Thereafter, the residual resist film ratio was measured and used as an indicator of dry etching resistance.

Very good: A residual film ratio of 95% or more
Good: 90% or more and less than 95%
Bad: Less than 90%

The following evaluation results are shown in Table 5.

TABLE 5

| Example | Composition | Sensitivity (mJ/cm²) | Resolving Power (nm) | Pattern Profile | LER (nm) | Dry Etching Resistance |
|---|---|---|---|---|---|---|
| 1F | N1 | 12.8 | 25 | Rectangle | 4.2 | Very good |
| 2F | N9 | 12.6 | 25 | Rectangle | 4.5 | Very good |
| 3F | N10 | 12.3 | 30 | Slightly reverse taper | 4.5 | Good |
| 4F | N11 | 12.5 | 25 | Rectangle | 4.2 | Very good |
| 5F | N12 | 12.5 | 25 | Rectangle | 4.2 | Very good |
| 6F | N13 | 14 | 25 | Rectangle | 4.2 | Very good |
| Comparative Example 1F | Comparative Composition N1 | 14.8 | 40 | Reverse taper | 5.5 | Bad |
| Comparative Example 2F | Comparative Composition N2 | 14.8 | 40 | Slightly reverse taper | 5.5 | Good |

It is seen from the results shown in Table 5 that the composition according to the present invention has excellent sensitivity, resolving power, pattern profile, line edge roughness (LER), and dry etching resistance.

(III) Example as Chemical Amplification Negative Resist (Electron Beam Exposure, Development Using Organic Developing Solution)

Examples 1G to 6G and Comparative Examples 1G and 2G (Preparation of Resist Solution)

The composition shown in Table 3 was finely filtered through a membrane filter having a pore size of 0.04 μm and thus a resist coating solution was obtained.

(Preparation of Resist Film)

The resist coating solution was applied to a Cr oxide-deposited 6-inch wafer (a wafer subjected to a treatment of forming a shielding film, which is used for normal photo mask blank) by using a Mark 8, manufactured by Tokyo Electron Ltd. and dried on a hot plate at 130° C. for 90 seconds to obtain a resist film having a thickness of 100 nm. That is, a resist-coated mask blank was obtained.

The resist film was patternwise irradiated by using an electron beam lithography device (ELS-7500, manufactured by ELIONIX INC., accelerating voltage: 50 KeV). After the irradiation, the resist film was heated on a hot plate at 120° C. for 90 seconds, spray-developed for 30 seconds with a solvent obtained by mixing butyl acetate (boiling point=126° C.) as a good solvent and decane (boiling point=174° C.) as a poor solvent at a mass ratio of 85/15, and then thoroughly dried by spinning the wafer by a spin coater for 3,000 revolutions in 30 seconds.

(Evaluation of Resist Pattern)

The obtained pattern was evaluated for the sensitivity, resolving power, pattern profile, line edge roughness (LER), and dry etching resistance by the same methods as those for evaluations in (I) Example as Chemical Amplification Negative Resist (Electron Beam Exposure, Alkali Development).

The evaluation results are shown in Table 6.

TABLE 6

| Example | Composition | Sensitivity (μC/cm$^2$) | Resolving Power (nm) | Pattern Profile | LER (nm) | Dry etching resistance |
|---|---|---|---|---|---|---|
| 1G | N1 | 10.8 | 25 | Rectangle | 3.6 | Very good |
| 2G | N9 | 11.2 | 25 | Rectangle | 4 | Very good |
| 3G | N10 | 11.3 | 30 | Slightly reverse taper | 4 | Good |
| 4G | N11 | 11.1 | 25 | Rectangle | 3.6 | Very good |
| 5G | N12 | 11 | 25 | Rectangle | 3.6 | Very good |
| 6G | N13 | 12 | 25 | Rectangle | 3.6 | Very good |
| Comparative Example 1G | Comparative Composition N1 | 13.8 | 40 | Reverse taper | 5 | Bad |
| Comparative Example 2G | Comparative Composition N2 | 13.8 | 40 | Slightly reverse taper | 5 | Good |

It is seen from the results shown in Table 6 that the composition according to the present invention has excellent sensitivity, resolving power, pattern profile, line edge roughness (LER) and dry etching resistance.

What is claimed is:

1. An actinic ray sensitive or radiation sensitive resin composition comprising:

a polymer compound (A) having a phenolic hydroxyl group and satisfying the following (a) and (b);

a compound (B) capable of generating an acid upon irradiation with actinic rays or radiation; and a crosslinking agent (C) for crosslinking the polymer compound (A) by the action of an acid and having a glass transition temperature (Tg) of 200° C. or higher:

(a) the weight-average molecular weight is 3,000 or more and 6,500 or less, and (b) the glass transition temperature (Tg) is 140° C. or higher, wherein the crosslinking agent (C) contains two or more crosslinking groups of at least one selected from the group consisting of hydroxymethyl groups and alkoxymethyl groups, two or more benzene rings, and a cyclic aliphatic hydrocarbon group, and the ratio of the number of crosslinking groups to the number of benzene rings is 1.0 or less.

2. The actinic ray sensitive or radiation sensitive resin composition according to claim 1, wherein the polymer compound (A) further satisfies the following (c):

(c) the dispersity (Mw/Mn) is 1.2 or less.

3. The actinic ray sensitive or radiation sensitive resin composition according to claim 1, wherein the polymer compound (A) has a repeating unit having a phenolic hydroxyl group, and a repeating unit having a group formed by substituting a hydrogen atom of a hydroxyl group in a phenolic hydroxyl group with a substituent.

4. The actinic ray sensitive or radiation sensitive resin composition according to claim 1, wherein the polymer compound (A) has a repeating unit represented by Formula (II) below in an amount of 10 mol % to 90 mol % with respect to the all repeating units of the polymer compound (A),

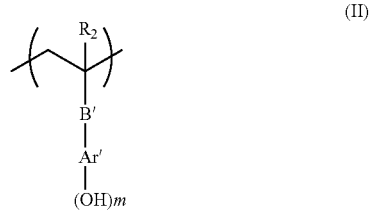

wherein in the formula, R$_2$ represents a hydrogen atom, a methyl group which may have a substituent, or a halogen atom, B' represents a single bond or a divalent organic group, Ar' represents an aromatic ring group, and m represents an integer of 1 or more.

5. A resist film that is formed by using the actinic ray sensitive or radiation sensitive resin composition according to claim 1.

6. The resist film according to claim 5, wherein the film thickness thereof is 10 nm to 150 nm.

7. A resist-coated mask blank comprising:
a mask blank; and
the resist film according to claim 5 which is formed on the mask blank.

8. A resist pattern forming method comprising:
exposing the resist film according to claim 5; and
developing the exposed film.

9. A resist pattern forming method comprising:
exposing the resist-coated mask blank according to claim 7; and
developing the exposed resist-coated mask blank.

10. The resist pattern forming method according to claim 8,
wherein the exposure is performed using an electron beam or extreme-ultraviolet rays.

11. A photo mask that is obtained by exposing and developing the resist-coated mask blank according to claim 7.

* * * * *